United States Patent
Honjo et al.

(10) Patent No.: US 8,183,738 B2
(45) Date of Patent: May 22, 2012

(54) CONTROL SYSTEM FOR OSCILLATORY ACTUATOR

(75) Inventors: Kenichi Honjo, Osaka (JP); Hideaki Mukae, Hyogo (JP); Yusuke Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 459 days.

(21) Appl. No.: 12/469,257

(22) Filed: May 20, 2009

(65) Prior Publication Data

US 2009/0224718 A1 Sep. 10, 2009

Related U.S. Application Data

(63) Continuation-in-part of application No. PCT/JP2008/000600, filed on Mar. 14, 2008.

(30) Foreign Application Priority Data

Mar. 16, 2007 (JP) .................................. 2007-068329

(51) Int. Cl.
H01L 41/09 (2006.01)
(52) U.S. Cl. ........................................................ 310/317
(58) Field of Classification Search .................. 310/317, 310/323.01–323.03, 323.16, 328
See application file for complete search history.

(56) References Cited

U.S. PATENT DOCUMENTS

| | | | |
|---|---|---|---|
| 5,874,799 A | 2/1999 | Mitarai et al. | |
| 5,939,851 A | 8/1999 | Kataoka et al. | |
| 6,084,334 A | 7/2000 | Yamamoto et al. | |
| 6,084,335 A | 7/2000 | Tamai | |
| 6,252,333 B1 | 6/2001 | Iino et al. | |
| 7,154,208 B2 | 12/2006 | Kataoka | |
| 7,408,288 B2 * | 8/2008 | Hara .......................... | 310/323.01 |
| 7,701,115 B2 * | 4/2010 | Higashionji et al. ........... | 310/315 |
| 2002/0180387 A1 | 12/2002 | Kataoka | |
| 2003/0173869 A1 * | 9/2003 | Kato et al. ..................... | 310/328 |
| 2007/0138910 A1 * | 6/2007 | Ganor et al. .................. | 310/328 |

(Continued)

FOREIGN PATENT DOCUMENTS

JP 05-184167 7/1993

(Continued)

OTHER PUBLICATIONS

International Search Report and Written Opinion for corresponding Application No. PCT/JP2008/000600 mailed Jun. 17, 2008.

(Continued)

*Primary Examiner* — Thomas Dougherty
(74) *Attorney, Agent, or Firm* — Renner, Otto, Boisselle & Sklar, LLP

(57) ABSTRACT

In driving a target body only by one of actuators, the target body is smoothly driven.
A drive unit (1) includes a stage (3), a first ultrasonic actuator (4A) for driving the stage (3) in an X direction and a second ultrasonic actuator (4B) for driving the stage (3) in a Y direction. When the stage (3) is driven only in one of the X direction and the Y direction, one of the first and second ultrasonic actuators (4A and 4B) which corresponds to the direction generates composite vibration of longitudinal direction parallel to a contact surface of the stage (3) and bending vibration perpendicular to the contact surface of the stage (3). On the other hand, the other one of the first and second ultrasonic actuators (4A and 4B) generates only longitudinal vibration parallel to the contact surface of the stage (3).

3 Claims, 17 Drawing Sheets

U.S. PATENT DOCUMENTS

| | | | |
|---|---|---|---|
| 2009/0224630 A1* | 9/2009 | Adachi et al. | 310/317 |
| 2009/0230818 A1* | 9/2009 | Mukae et al. | 310/323.16 |
| 2010/0181870 A1* | 7/2010 | Nagaoka et al. | 310/323.16 |

FOREIGN PATENT DOCUMENTS

| | | |
|---|---|---|
| JP | 06-158490 | 6/1994 |
| JP | 08-298795 | 11/1996 |
| JP | 10-150786 | 6/1998 |
| JP | 10-187245 | 7/1998 |
| JP | 11-196587 | 7/1999 |
| JP | 11-235063 | 8/1999 |
| JP | 2002-369557 | 12/2002 |

OTHER PUBLICATIONS

Form PCT/ISA/237.

* cited by examiner

CONTROL SYSTEM FOR OSCILLATORY ACTUATOR

CROSS-REFERENCE TO RELATED APPLICATION

This application is a continuation-in-part of PCT International Application PCT/JP2008/000600, filed on Mar. 14, 2008, which claims priority on Japanese Patent Application No. 2007-068329, filed on Mar. 16, 2007, the entire disclosures of which are expressly incorporated by reference herein.

TECHNICAL FIELD

The present invention relates to a control system for an oscillatory actuator.

BACKGROUND

Conventionally, there have been known drive units for driving a target body to be driven using an actuator. A drive unit disclosed in Patent Document 1 is an example of such drive units.

The drive unit disclosed in Patent Document 1 includes a stage as a target body to be driven, two first actuators for driving the target body in a predetermined X direction and two second actuators for driving the target body in a Y direction which is perpendicular to the X direction.

Each of the first and second actuators is formed of a piezoelectric element having a rectangular shape when viewed from the top and generates longitudinal vibration and bending vibration. Each of the first and second actuators is provided so as to be in contact with the stage and, in this state, the piezoelectric elements are configured to generate longitudinal vibration and bending vibration, so that the stage is moved by friction force between each of the actuators and the stage. Specifically, the stage can be moved in any direction between the X direction and the Y direction by adjusting a moving distance of the stage by the first actuators and a moving distance of the stage by the second actuators.
Patent Document 1: Japanese Published Patent Application No. Hi 1-235063

SUMMARY

In an oscillatory actuator, an actuator and a target body to be driven are in contact with each other. Thus, vibration of the actuator is directly transmitted to the target body and thus the target body is moved. Friction force acts between the actuator and the target body. When the target body is in contact with a predetermined contact section, vibration of the actuator is transmitted to the target body but the target body can not be moved further, so that respective parts of the actuator and the target body in contact slip on each other. If the slips at a contact section last for a long time, abrasion is caused.

In view of the above-described points, it is an object of the present invention to prevent abrasion of an actuator and a target body to be driven caused by slips of the actuator and the target boy when the movement of the target body is mechanistically limited.

To achieve the object, a control system for an oscillatory actuator includes: a base; a target body to be driven formed to be movable in a predetermined direction with respect to the base; an actuator body, including a piezoelectric element and a driver element, for moving the target body with respect to the base by combining longitudinal vibration and transverse vibration of the piezoelectric element to have the driver element make an approximately elliptical motion; a location detection sensor for detecting a location of the target body with respect to the base; and a control section for supplying, in order to move the target body to a command location, a drive signal corresponding to the command location to the actuator body, and the control section halts supply of the drive signal when an absolute value of a difference between the command location and the location of the target body detected by the location detection sensor becomes larger than a predetermined threshold.

According to the control system, when movement of a target body to be driven is mechanistically limited, slip of an actuator and the target body can be suppressed to a minimum level and abrasion of an actuator and the target body due to slips of the actuator and the target body can be prevented.

BRIEF DESCRIPTION OF THE DRAWINGS

In FIG. 11, (A) shows a drive signal to shift a stage in the A direction of FIG. 10, (B) shows a drive signal to shift the stage in the B direction of FIG. 10 and (C) shows a drive signal to halt the stage.

FIG. 17A illustrates the oscillatory actuator control circuit in a state of where an A stage is in contact with a contact section. FIG. 17B is illustrates the oscillatory actuator control circuit in a state where the stage is not in contact with the contact section.

EXPLANATION OF REFERENCE NUMERALS

| | |
|---|---|
| 3 | Stage (target body to be driven) |
| 4A, 204A and 304A | First ultrasonic actuator (first actuator) |
| 4B, 204B and 304B | Second ultrasonic actuator (second actuator) |
| 5 | Actuator body |
| 59 | Driver element |

DESCRIPTION OF THE PREFERRED EMBODIMENTS

Hereinafter, embodiments of the present invention will be described in detail with reference to the accompanying drawings.

<<Embodiment 1>>

Figure 1:
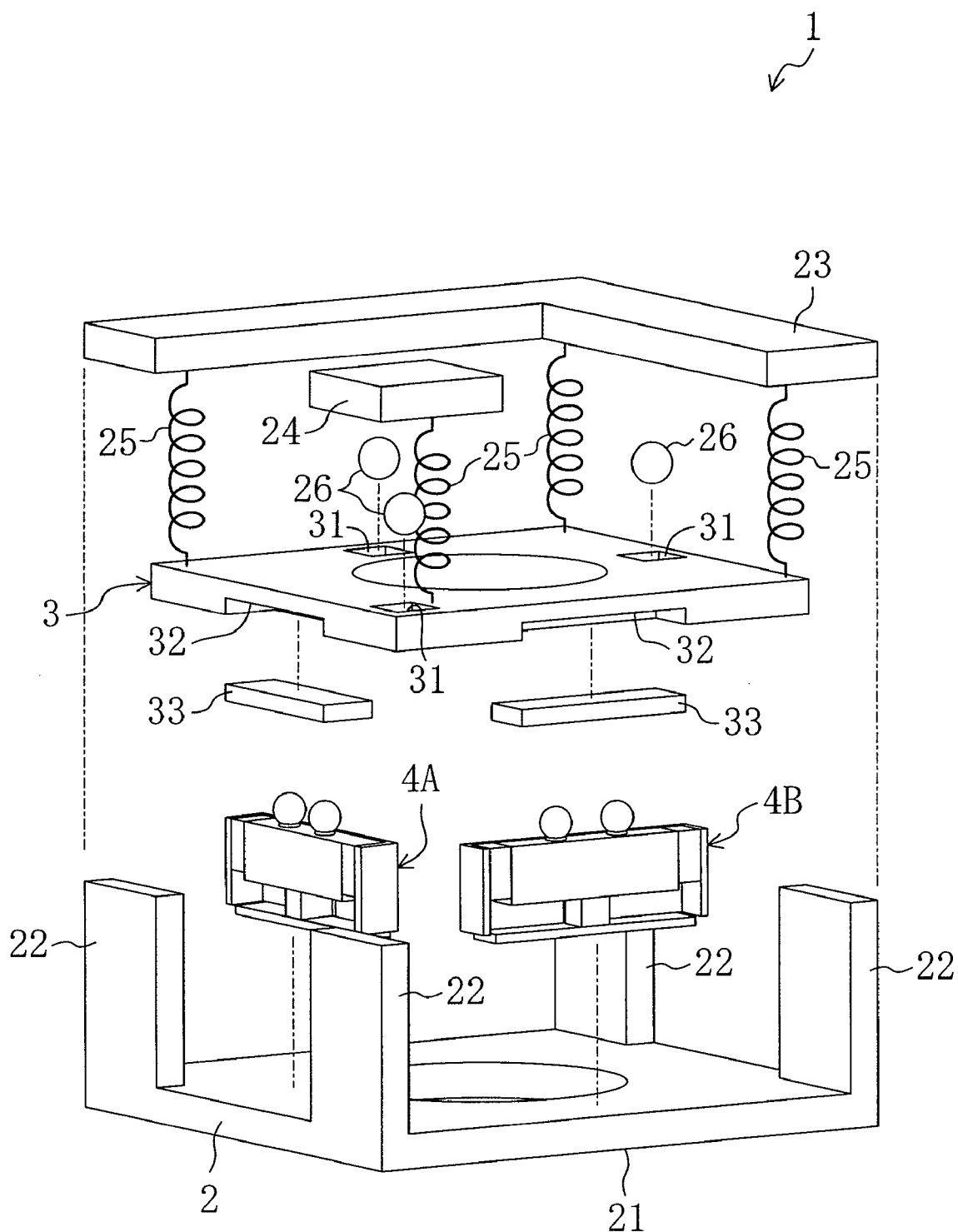
FIG. 1 is an exploded perspective view illustrating a structure of a drive unit according to Embodiment 1.
Figure 2:
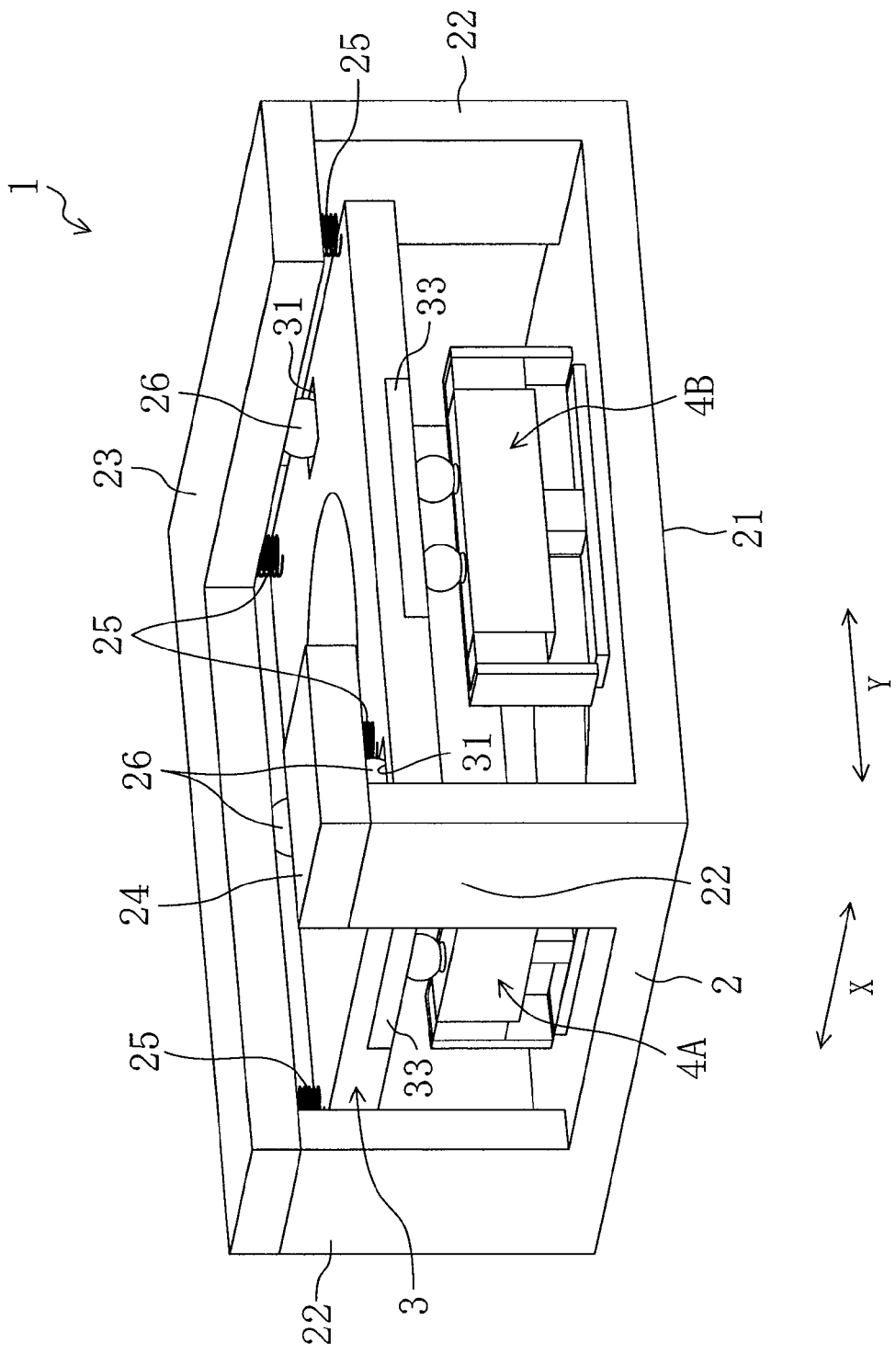
FIG. 2 is a perspective view of a drive unit.

As shown in FIGS. 1 and 2, a drive unit 1 according to Embodiment 1 of the present invention includes a fixed member 2, a stage 3 movably supported relative to the fixed member 2, first and second ultrasonic actuators 4A and 4B for driving the stage 3 and a control unit (not shown) for performing drive control to the first and second ultrasonic actuators 4A and 4B.

The fixed member 2 includes a bottom wall portion 21 having a square shape when viewed from the top, four side wall sections 22 projecting upward from four corners of the bottom wall portion 21, respectively, and a first ceiling wall section 23 which is to be attached to edge portions of three of the side wall sections 22 so as to be opposed to the bottom wall portion 21, and a second ceiling wall section 24 which is to be attached to an end portion of the other one of the side wall sections 22 so as to be opposed to the bottom wall portion 21. The side wall sections 22 are formed so that each of side edge potions of the bottom wall portion 21 which are opposed to each other as a pair has two of the side wall sections 22 provided thereon. The two side wall sections 22 provided on each of the pair of side edge portions of the bottom wall portion 21 are located on both ends of each of the side edge portions, respectively. The first ceiling wall section 23 is a flat plate member having an approximately L shape when viewed from the top and extending over the end portions of the three side wall sections 22. The second ceiling wall section 24 is a flat plate member having an approximately square shape when viewed from the top.

The stage 3 is a metal flat plate member having a square shape when viewed from the top. The stage 3 is placed in the fixed member 2 so as to be spaced from the side wall sections 22. The stage 3 may be formed of resin such as polycarbonate or the like. The stage 3 constitutes a target body to be driven.

In one side edge portion at a lower surface of the stage 3 and one of two other side edge portions at the lower surface each of which is perpendicular to the side edge portion, openings are respectively provided so that each of the openings extends from the lower surface to a side surface of the stage 3, thereby providing concave portions 32. Ceramic reinforcing members 33 are inserted in and bonded to the concave portions 32, respectively. The reinforcing members 33 are arranged so as to be flush with the lower surface of the stage 3. The reinforcing members 33 are not limited to ceramic-made members but may be members made of any material having abrasion resistance.

The stage 3 is supported at its four corners by support springs 25 with respect to the first ceiling wall section 23 and the second ceiling wall section 24. In this state, metal round rolling elements 26 (three rolling elements in this embodiment) are provided between the stage 3, and each of the first ceiling wall section 23 and the second ceiling wall section 24. On an upper surface of the stage 3 (which is a surface opposed to the first ceiling wall section 23 and the second ceiling wall section 24), receiving holes 31 are formed to restrict relative displacement of the rolling elements 26 with respect to the stage 3. The rolling elements 26 are placed in the receiving holes 31, respectively, and are in contact with respective lower surfaces of the first ceiling wall section 23 and the second ceiling wall section 24. More specifically, two of the rolling elements 26 are interposed between the stage 3 and the first ceiling wall section 23 and the other one of the rolling elements 26 is interposed between the stage 3 and the second ceiling wall section 24. Thus, the stage 3 is formed so as to be bias-supported with certain space from the first ceiling wall section 23 and the second ceiling wall section 24 and also to be movable in parallel to the upper and lower surfaces of the stage 3 with the rolling elements 26 interposed between the stage 3 and each of the first ceiling wall section 23 and the second ceiling wall section 24.

Figure 3:
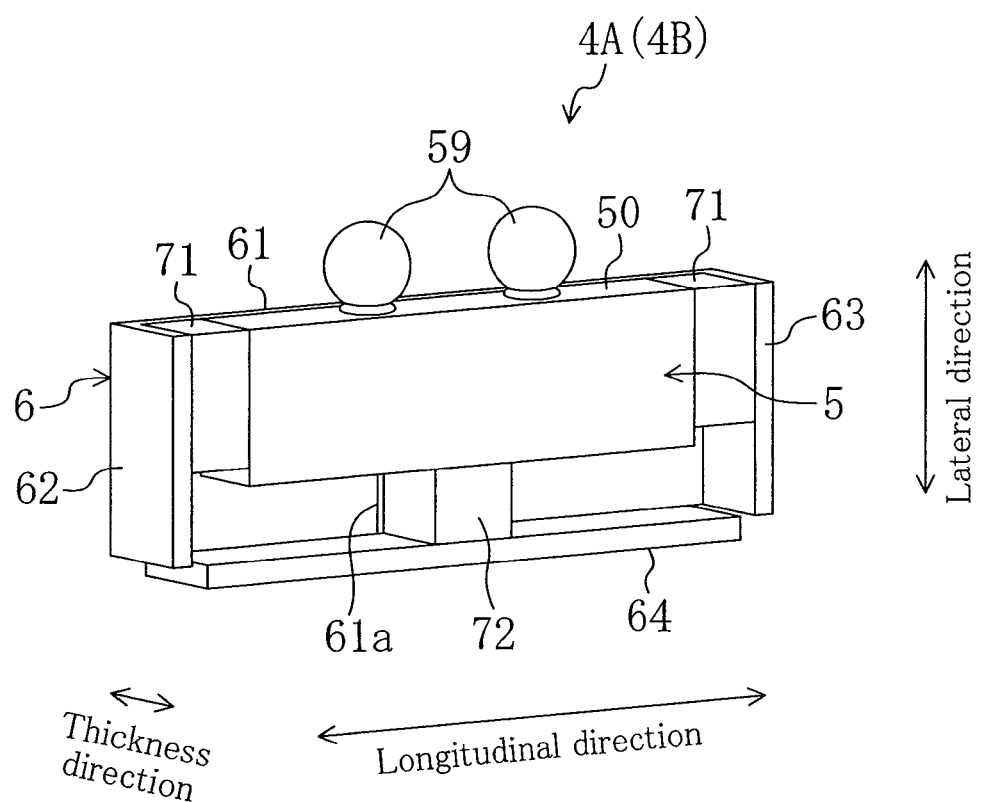
FIG. 3 is a perspective view of an ultrasonic actuator.

The first and second ultrasonic actuators 4A and 4B have the same structure. As shown in FIG. 3, each ultrasonic actuator 4A (4B) includes an actuator body 5 for generating vibration, driver elements 59 for transmitting driving force of the actuator body 5 to the stage 3, a case 6 for housing the actuator body 5, support rubbers 71, provided between the actuator body 5 and the case 6, for elastically supporting the actuator body 5 and a bias rubber 72 for biasing the actuator body 5 to the stage 3.

The actuator body 5 is formed of a piezoelectric element 50.

The piezoelectric element 50 has an approximately rectangular parallelepiped shape including a pair of principal surfaces each having an approximately rectangular shape and being opposed to each other, a pair of long side surfaces each being perpendicular to each of the principal surfaces, extending along long sides of the principal surfaces and being opposed to each other, and a pair of short side surfaces each being perpendicular to each of the principal surfaces and the long side surfaces and extending along short sides of the principal surfaces.

Figure 4:
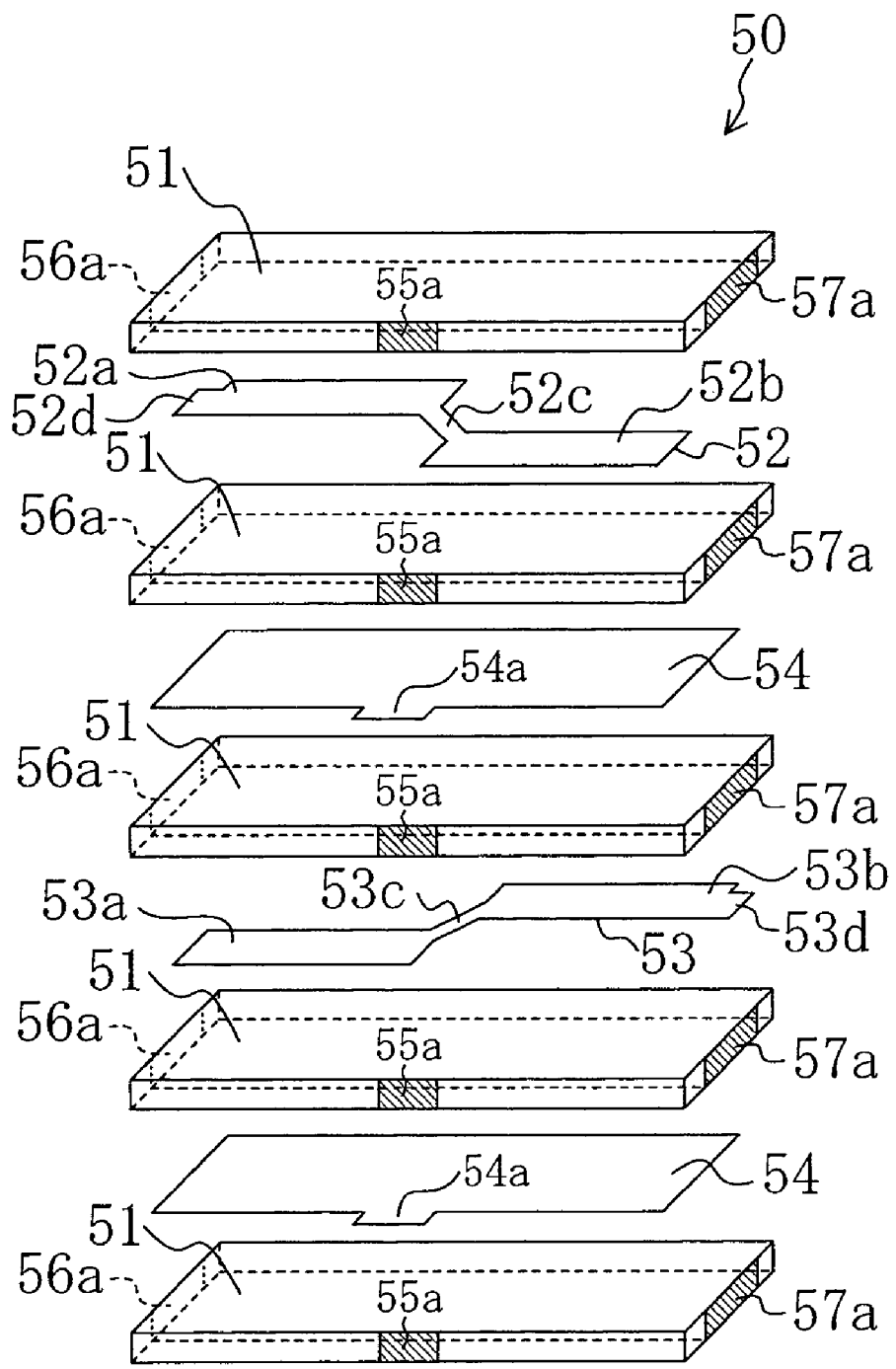
FIG. 4 is an exploded perspective view of a piezoelectric element.

As shown in FIG. 4, the piezoelectric element 50 includes five piezoelectric element layers 51 and four internal electrode layers 52, 54, 53 and 54, which are alternately stacked. Specifically, the internal electrode layers 52, 54, 53 and 54 are, respectively, formed of a first power supply electrode layer 52, a common electrode layer 54, a second power supply electrode layer 53 and another common electrode layer 54 which are alternately provided in a stacking direction with each of the piezoelectric element layers 51 interposed between any two of the internal electrode layers. Each of the first power supply electrode layer 52, the second power supply electrode layer 53 and the common electrode layers 54 is printed on an associated one of the piezoelectric element layers 51.

Each of the piezoelectric element layers 51 is an insulation layer, for example, formed of a ceramic material such as lead zirconate titanate and has an approximately rectangular parallelepiped shape including a pair of principal surfaces, a pair of long side surfaces and a pair of short side surfaces in the same manner as the piezoelectric element 50. Moreover, an external electrode 55a is formed in center part of a long side surface in the longitudinal direction, in which the driver elements 59 are not provided, an external electrode 56*a* is formed in center part of one short side surface in the lateral direction, and an external electrode 57*a* is formed in center part of the other short side surface in the lateral direction.

Each of the common electrode layers 54 has an approximately rectangular shape provided approximately on an entire principal surface of an associated one of the piezoelectric element layers 51. Moreover, a lead electrode 54*a* is formed in one long side portion of each of the common electrode layers 54 so as to extend from center part of the common electrode layer 54 in the longitudinal direction thereof to the external electrode 55*a* of the piezoelectric element layer 51.

Figure 5:
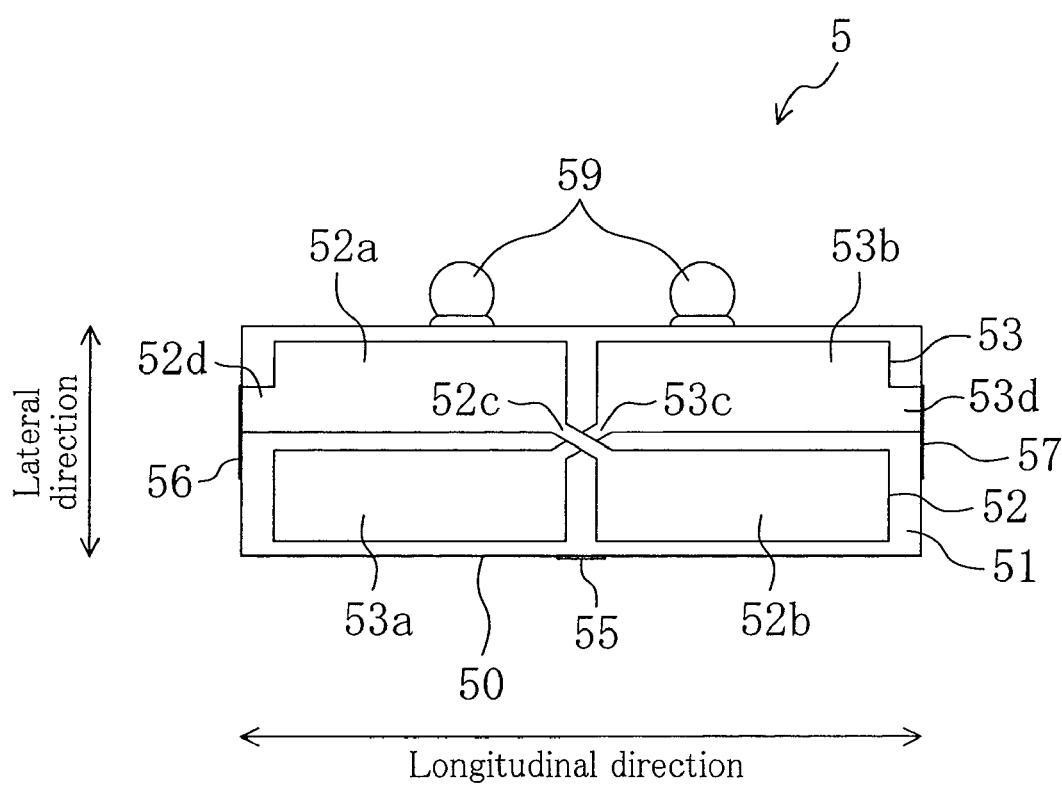
FIG. 5 is a schematic front view illustrating a structure of an actuator body.

Suppose that the principle surface of each of the piezoelectric element layers 51 is divided in four areas, i.e., two areas in the longitudinal direction and two areas in the lateral direction. As shown in FIG. 5, the first power supply electrode layer 52 includes first electrodes 52*a* and 52*b* respectively formed in one pair of the areas located in one diagonal direction of the principal surface, and a conductive electrode 52*c* for connecting the first electrodes 52*a* and the 52*b* to bring them in conduction. Each first electrode 52*a* (52*b*) is an electrode having an approximately rectangular shape and overlaps with the common electrode layers 54 when viewed in the stacking direction. That is, each first electrode 52*a* (52*b*) is opposed to an associated one of the common electrode layers 54 with an associated one of the piezoelectric element layers 51 interposed therebetween. One of the first electrodes 52*a* and 52*b*, i.e., the first electrode 52*a* is provided with a lead electrode 52*d* extending to the external electrode 56*a* of the piezoelectric element layer 51.

The second power supply electrode layer 53 includes a pair of second electrodes 53*a* and 53*b* respectively formed in the other pair of the areas located in the other diagonal direction of the principal surface, and a conductive electrode 53*c* for connecting the second electrodes 53*a* and the 53*b* to bring them in conduction. When viewed in the stacking direction, the second electrode 53*a* is provided in one area of the other pair, which is located adjacent to the first electrode 52*a* in the lateral direction and adjacent to the first electrode 52*b* in the longitudinal direction, and the second electrode 53*b* is provided in the other area of the same pair, which is located adjacent to the first electrode 52*a* in the longitudinal direction and adjacent to the first electrode 52*b* in the lateral direction. Each second electrode 53*a* (53*b*) is an electrode having an approximately rectangular shape and overlaps with the common electrode layers 54, when viewed in the stacking direction. That is, each second electrode 53*a* (53*b*) is opposed to an associated one of the common electrode layers 54 with an associated one of the piezoelectric element layers 51 interposed therebetween. Moreover, one of the first electrodes 53*a* and 53*b*, i.e., the second electrode 53*b* is provided with a lead electrode 53*d* extending to the external electrode 57*a* of the piezoelectric element layer 51.

In the piezoelectric element 50 formed by alternately stacking the piezoelectric element layers 51 and the internal electrode layers 52, 54, 53 and 54, the respective external electrodes 55*a* of the piezoelectric element layers 51 align in the stacking direction in center part of one long side surface thereof in the longitudinal direction, thereby forming an integrated external electrode 55. The lead electrodes 54*a* provided to the common electrode layers 54 are electrically connected to the integrated external electrode 55. In the same manner, the respective external electrodes 56*a* of the piezoelectric element layers. 51 align in the stacking direction in center part of one short side surface of the piezoelectric element 50 in the lateral direction, thereby forming an integrated external electrode 56. The lead electrode 52*d* of the first power supply electrode layer 52 is electrically connected to the integrated external electrode 56. Furthermore, the respective external electrode 57*a* of the piezoelectric element layers 51 align in the stacking direction in center part of the other short side surface of the piezoelectric element 50 in the lateral direction, thereby forming an integrated external electrode 57. The lead electrode 53*d* of the second power supply electrode layer 53 is electrically connected to the integrated external electrode 57.

On the other long side surface of the piezoelectric element 50 in which the external electrodes 55*a* are not provided, the driver elements 59 are provided to align in the longitudinal direction so as to be spaced apart from each other. The driver elements 59 are provided in parts of the long side surface located at a distance of 30% to 35% of the full length of the long side surface inwardly from both edges in the longitudinal direction, respectively. Each of the locations of the driver elements 59 corresponds to a loop of a second mode of bending vibration where vibration is maximum. Each of the driver elements 59 has an approximately spherical phase and is formed of a hard material such as ceramic and the like.

Figure 6:
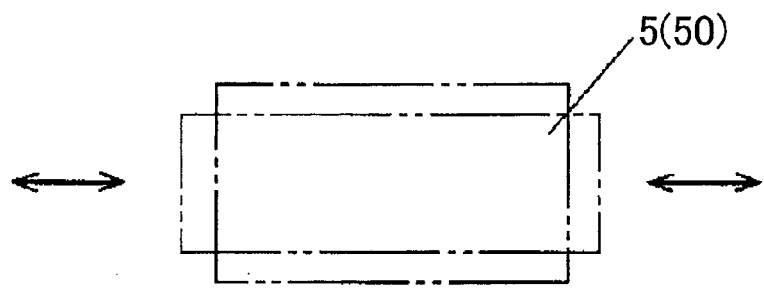
FIG. 6 is a conceptual diagram illustrating displacement made by a first mode of expand/contract vibration of a piezoelectric element.
Figure 7:
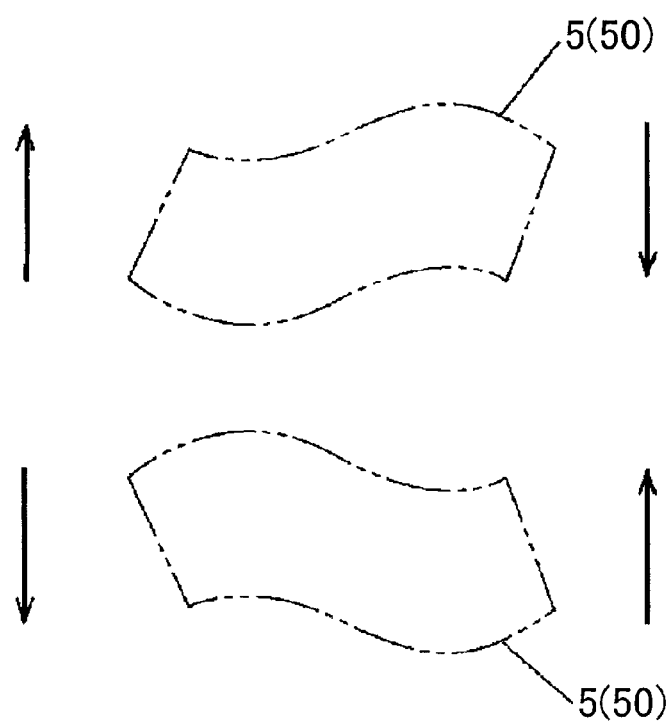
FIG. 7 is a conceptual diagram illustrating displacement made by a second mode of bending vibration of a piezoelectric element.
Figure 8A:
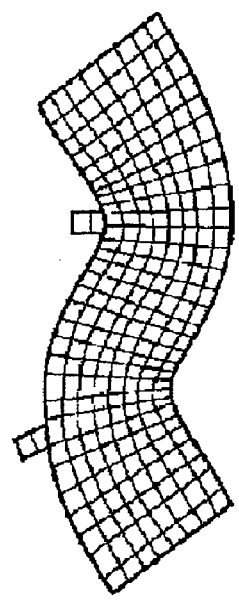
FIGS. 8A through 8D are conceptual diagrams illustrating the operation of a piezoelectric element.
Figure 8B:
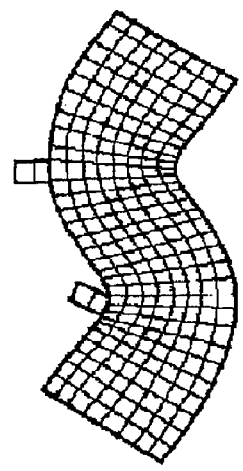
Figure 8C:
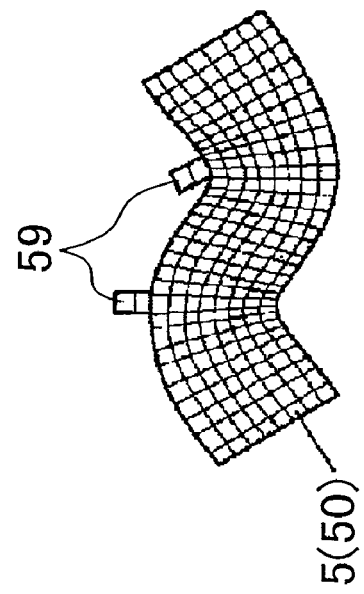
Figure 8D:
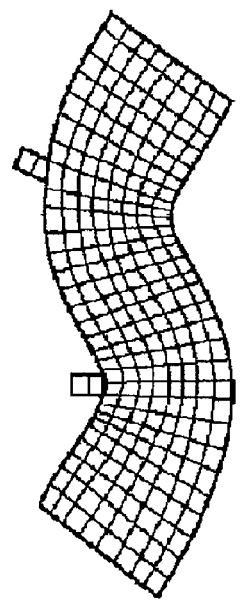

The external electrode 55 is connected to the ground. An alternating voltage at a predetermined frequency is applied to the external electrode 56. An alternating voltage of a phase shifted from the phase of the alternating voltage by 90° is applied to the external electrode 57. Thus, alternating voltages which have different phases from each other by 90° are applied to the one pair of the first electrodes 52*a* and 52*b* and the other pair of the second electrode 53*a* and 53*b*, respectively, each of which is located in an associated one of the diagonal directions of the principal surface of each piezoelectric element layer 51, so that a first mode of longitudinal vibration (i.e., so-called expand/contract vibration) shown in FIG. 6 and a second mode of bending vibration shown in FIG. 7 are induced.

Respective resonance frequencies of longitudinal vibration and bending vibration are determined by a material, a shape and the like of the piezoelectric element 50. Furthermore, the resonance frequencies both are influenced by force supporting the piezoelectric element 50 and a position where the piezoelectric element 50 is supported. Taking this into consideration, the resonance frequencies are substantially matched to each other. Alternating voltages having a frequency around the resonance frequencies and phases shifted by 90° from each other are applied to the external electrodes 56 and 57, respectively. Thus, the first mode of longitudinal vibration and the second mode of bending vibration are harmonically induced in the piezoelectric element 50, so that the piezoelectric element 50 changes itself into shapes shown in FIGS. 8A, 8B, 8C and 8D in this order.

As a result, each of the driver elements 59 provided to the piezoelectric element 50 makes an approximately elliptical motion in a plane parallel to a principal surface of the piezoelectric element 50 (i.e., a plane parallel to the drawing sheet of FIGS. 8A through 8D).

The case 6 is formed of resin and has an approximately rectangular parallelepiped box shape corresponding to the piezoelectric element 50. The case 6 includes a principal wall portion 61 which is parallel to the principal surface of the piezoelectric element 50 and has an approximately rectangular shape, a first short side wall portion 62 provided at a short side portion located at one side in the longitudinal direction (i.e., the left side of FIG. 3) of the principal wall portion 61, a second short side wall portion 63 provided at a short side portion located at the other side in the longitudinal direction (i.e., the right side of FIG. 3) of the principal wall portion 61, and a long side wall portion 64 provided at a long side portion located at one side in the lateral direction (i.e., the lower side of FIG. 3) of the principal wall portion 61. That is, no wall portion is provided at a plane opposed to the principal wall portion 61 and a long side portion (corresponding to the long side surface of the piezoelectric element 50 on which the driver elements 59 are provided) of the case 6 lo located at the other side in the lateral direction (i.e., the upper side of FIG. 3) of the principal wall portion 61, so that the case 6 is open at the above-described one side in the thickness direction (in the normal direction of the principal wall portion 61) and at the above-described other side of the lateral direction.

The actuator body 5 is placed in the case 6 having the above-described structure. Specifically, the actuator body 5 is placed in the case 6 so that one of the principal surfaces of the piezoelectric element 50 is in contact with the principal wall portion 61 and one of the long side surfaces of the piezoelectric element 50 (at which the external electrode 55 is provided) is opposed to the long side wall portion 64. In this state, the driver elements 59 stick out from the case 6 at the above-described other side in the lateral direction. The support rubbers 71 are provided between the one of the short side surfaces of the piezoelectric element 50 and the first short side wall portion 62 of the case 6 and between the other one of the short side surfaces of the piezoelectric element 50 and the second short side wall portion 63 of the case 6, respectively. Because the support rubbers 71 are elastic, the piezoelectric element 50 can be supported without damping longitudinal vibration of the piezoelectric element 50 although each of the side surfaces of the piezoelectric element 50 corresponds to a loop of longitudinal vibration. The support rubbers 71 are in contact with not only the actuator body 5 and the first and second short side wall portions 62 and 63 but also an inner surface of the principal wall portion 61. Moreover, the bias rubber 72 is provided between one of the long side surfaces of the piezoelectric element 50 and the long side wall portion 64 of the case 6. The bias rubber 72 is in contact with not only the actuator body 5 and the long side wall portion 64 but also the inner surface of the principal wall portion 61.

Electrodes 61a are provided in parts of the inner surface of the principal wall portion 61 in which the support rubbers 71 and the bias rubber 72 are in contact (only the electrodes 61a in contact with the bias rubber 72 is shown). The electrodes 61a are in conduction with terminal electrodes (not shown) provided on an outer surface of the principal wall portion 61, respectively.

Each of the support rubbers 71 is formed of conductive rubber obtained by mixing metal particles into silicone rubber and has an approximately rectangular parallelepiped shape. The support rubbers 71 elastically support the actuator body 5 with the actuator body 5 biased in the longitudinal direction thereof. Also, the support rubbers 71 bring the external electrodes 56 and 57 of the piezoelectric element 50 into conduction with electrodes which are provided at the short side portions of the inner surface of the principal wall portion 61 and are conductive with the terminal electrodes, respectively.

The bias rubber 72 is also formed of conductive rubber obtained by mixing metal particles into silicone rubber and has an approximately rectangular parallelepiped shape in the same manner as the support rubbers 71. The bias rubber 72 biases the actuator body 5 in the lateral direction thereof (i.e., the lateral direction corresponds to a bias direction). The bias rubber 72 also brings the external electrode 55 of the piezoelectric element 50 into conduction with the electrode 61a of the principal wall portion 61.

That is, power can be supplied to the piezoelectric element 50 by supplying power to the terminal electrodes provided on the outer surface of the case 6.

The first and second ultrasonic actuators 4A and 4B having the above-described structure are provided between the stage 3 and the bottom wall portion 21 of the fixed member 2. The first and second ultrasonic actuators 4A and 4B are arranged so that the long side wall portion 64 of the case 6 is fixed to the bottom wall portion 21 of the fixed member 2 and the driver elements 59 are in contact with a lower surface of the stage 3. That is, the first and second ultrasonic actuators 4A and 4B are arranged so that the lateral direction of the piezoelectric element 50 is perpendicular to the lower surface of the stage 3 and the longitudinal direction of the piezoelectric element 50 is in parallel to the lower surface of the stage 3. In other words, the first and second ultrasonic actuators 4A and 4B are arranged so that the direction of bending vibration of the piezoelectric element 50 is perpendicular to the lower surface of the stage 3 and the direction of longitudinal vibration of the piezoelectric element 50 is in parallel to the lower surface of the stage 3.

In this state, the bias rubber 72 is compressed and deformed and the driver elements 59 are biased against the reinforcing members 33 by elastic force of the bias rubber 72. Bias force of each ultrasonic actuator 4A (4B) to the stage 3 is determined by the elastic force of the bias rubber 72.

Note that in this embodiment, the driver elements 59 are in contact with respective lower surfaces of the reinforcing members 33, respectively, at the lower surface of the stage 3. With the reinforcing members 33 provided, the abrasion resistance of the lower surface of the stage 3 is improved.

Figure 9:
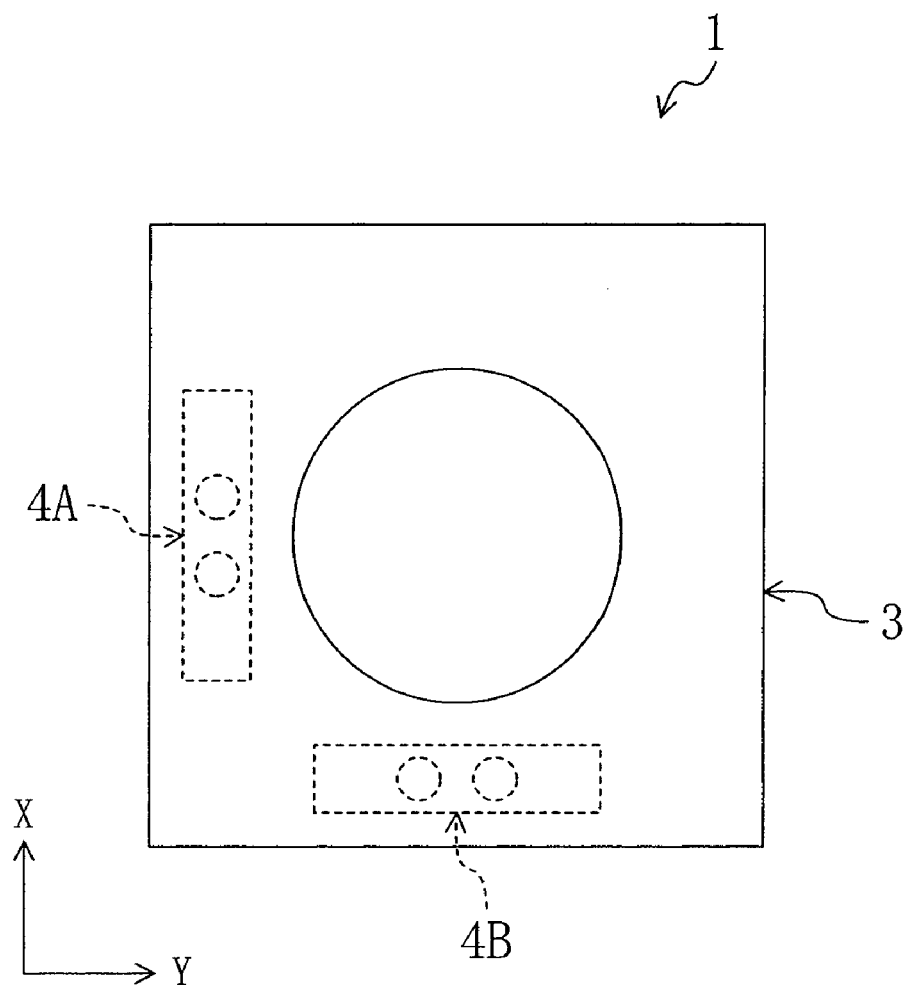
FIG. 9 is a schematic plan view illustrating an arrangement of an ultrasonic actuator.

More specifically, as shown in FIG. 9, the first ultrasonic actuator 4A is arranged in vicinity of one side edge portion of the lower surface of the stage 3 so that the longitudinal direction of the piezoelectric element 50 (i.e., a vibration direction of longitudinal vibration) is in parallel to the side edge portion (this direction is referred to as an X direction). On the other hand, the second ultrasonic actuator 4B is arranged in vicinity of another side edge portion of the lower surface of the stage 3 which is perpendicular to the above-described one side edge portion so that the longitudinal direction of the piezoelectric element 50 is in parallel to the side edge portion (this direction is referred to as a Y direction). In this manner, the first and second ultrasonic actuators 4A and 4B are arranged so that the longitudinal directions of the respective piezoelectric elements 50 are perpendicular to each other when viewed from the top. The first ultrasonic actuator 4A constitutes a first actuator and the second ultrasonic actuator 4B constitutes a second actuator. Furthermore, the X direction corresponds to a first driving direction and the Y direction corresponds to a second driving direction.

Hereinafter, a method for assembling the drive unit 1 will be described.

First, the first and second ceiling wall sections 23 and 24 of the fixed member 2 are attached to the respective end portions of the side wall sections 22.

Next, the rolling elements 26 are provided in the receiving holes 31 of the stage 3 and then the stage 3 is attached to the first and second ceiling wall sections 23 and 24 of the fixed member 2 by the support springs 25.

Subsequently, the first and second ultrasonic actuators 4A and 4B are provided between the bottom wall portion 21 of the fixed member 2 and the stage 3. In a state where the stage 3 is attached to the fixed member 2, a distance from the upper surface of the bottom wall portion 21 of the fixed member 2 to the lower surface of the stage 3 is shorter than a length of each of the first and second ultrasonic actuators 4A and 4B in the lateral direction. Then, in a state where the actuator body 5 is pressed toward the long side wall portion 64 of the case 6 and the bias rubber 72 is compressed and deformed, each ultrasonic actuator 4A (4B) is provided between the bottom wall portion 21 of the fixed member 2 and the stage 3. After each ultrasonic actuator 4A (4B) is placed in a desired location, the case 6 is fixed against the bottom wall portion 21 of the fixed member 2 and signal lines (not shown) are connected to the terminal electrodes provided on the outer surface of the case 6 from a control system (not shown). In this state, the driver elements 59 of each ultrasonic actuator 4A (4B) are in contact with the reinforcing members 33 of the stage 3.

-Operation of Drive Unit-

Next, the operation of the drive unit 1 having the above-described structure will be described.

As described above, in each of the first and the second ultrasonic actuators 4A and 4B, the external electrode 55 is connected to the ground via the terminal electrodes of the case 6 and an alternating voltage at a predetermined frequency and an alternating voltage having a phase shifted from the phase of the alternating voltage by 90° are applied to the external electrode 56 and the external electrode 57, respectively. Accordingly, the piezoelectric element 50 generates composite vibration of longitudinal vibration and bending vibration, thereby having the driver elements 59 make an approximately elliptical motion in a plane parallel to the principal surfaces of the piezoelectric element 50. Thus, while the driver elements 59 periodically repeat contact and separation with and from the stage 3, the stage 3 is moved by frictional force along a longitudinal direction of the piezoelectric element 50. That is, the first and second ultrasonic actuators 4A and 4B apply driving force to the stage 3 along the long longitudinal direction of the piezoelectric element 50. As shown in FIGS. 8A through 8D, the two driver elements 59 of each of the actuators make an approximately elliptical motion with their respective phases shifted from each other by 180° and accordingly the stage 3 is driven alternately by the driver elements 59. In Embodiment 1, the first ultrasonic actuator 4A moves the stage 3 in the X direction and the second ultrasonic actuator 4B moves the stage 3 in the Y direction.

Then, a movement in the X direction and a movement in the Y direction are combined by adjusting respective moving distances of the stage 3 by the first ultrasonic actuator 4A and the second ultrasonic actuator 4B, so that the stage 3 can be moved in any direction in a plane parallel to the lower surface of the stage 3 (which is, specifically, the lower surface of the reinforcing members 33). More specifically, the moving distance by each ultrasonic actuator 4A (4B) can be adjusted by adjusting at least one of a voltage value, a frequency and a supply time of an alternating voltage to be supplied to each of the external electrodes 56 and 57, or by changing an amount of the shift between phases of alternating voltages to be supplied to the external electrode 56 and the external electrode 57, respectively, to some other value than 90°. In moving the stage 3 by combining the movement in the X direction and the movement in the Y direction in the above-described manner, the first ultrasonic actuator 4A and the second ultrasonic actuator 4B may be simultaneously driven to move the stage 3 toward a desired location. Also, the first ultrasonic actuator 4A and the second ultrasonic actuator 4B may be alternately driven to move the stage 3 separately in the X direction and in the Y direction so that the stage 3 finally reaches a desired location.

Next, the case where the stage 3 is moved in only one of the X direction and the Y direction will be described. For example, in moving the stage 3 only in the X direction, the first ultrasonic actuator 4A causes the piezoelectric element 50 to generate composite vibration of longitudinal vibration and bending vibration to apply driving force to the stage 3, while the second ultrasonic actuator 4B causes the piezoelectric element 50 to generate vibration substantially only in a plane parallel to the lower surface of the stage 3 (specifically, the lower surface of the reinforcing members 33), i.e., generate only longitudinal vibration, thereby sliding the driver elements 59 with respect to the stage 3.

Specifically, the same alternating voltages are applied to the external electrode 56 and the external electrode 57 of the ultrasonic actuator 4B. That is, alternating voltages having the same phase are applied to the first electrodes 52*a* and 52*b* and the second electrodes 53*a* and 53*b* (see FIG. 5) of the piezoelectric element 50. Thus, four areas in the piezoelectric element 50 corresponding to the electrodes simultaneously expand and contract and thus, substantially only longitudinal vibration shown in FIG. 5 is induced in the piezoelectric element 50. In this state, in longitudinal vibration of FIG. 5, the piezoelectric element 50 slightly vibrates along the lateral direction thereof as well, but this vibration along the lateral direction is so small as to be ignorable, compared to longitudinal vibration along the longitudinal direction. That is, "substantially" means here that some other type of vibration exists but the size of the vibration is so small as to be ignorable.

As a result, friction force between the second ultrasonic actuator 4B and the stage 3 can be reduced, so that the stage 3 can be efficiently moved in the X direction by the first ultrasonic actuator 4A.

Hereinafter, this point will be explained in detail. Assume that in moving the stage 3 only in the X direction, the second ultrasonic actuator 4B is kept in a halt state and only the first ultrasonic actuator 4A is driven. In this case, even though the actuator body 5 of the second ultrasonic actuator 4B is in a halt state, the actuator body 5 is biased against the stage 3 and thus friction force between each of the driver elements 59 of the second ultrasonic actuator 4B and the stage 3 restricts driving of the stage 3 in the X direction by the first ultrasonic actuator 4A. Particularly, friction force between each of the driver elements 59 and the stage 3 is static friction until the stage 3 starts moving and, therefore, large driving force is needed at a time when the stage 3 starts moving. As shown in this embodiment, in the structure in which the stage 3 is driven by two ultrasonic actuators, the driving direction by the one ultrasonic actuator 4A (4B) is a direction which causes a moment of which a center is the driver elements 59 of the other ultrasonic actuator 4B (4A). Accordingly, if friction force between each of the driver elements 59 of the other ultrasonic actuator 4B (4A) is large, the stage 3 might rotate with the driver elements 59 of the second ultrasonic actuator 4B being centered In contrast, in Embodiment 1, when the first ultrasonic actuator 4A is driven, the second ultrasonic actuator 4B causes the piezoelectric element 50 to generate substantially only longitudinal vibration at the same time of driving the first ultrasonic actuator 4A or even before driving the first ultrasonic actuator 4A. As a result, the driver elements 59 slide with respect to the lower surface of the stage 3 and a friction state between each of the driver elements 59 and the lower surface of the stage 3 is changed from static friction to dynamic friction, thus reducing friction force.

Moreover, the driver elements 59 vibrate in parallel to the lower surface of the stage 3. Therefore, the sliding speed of the driver elements 59 with respect to the lower surface of the stage 3 is increased and thus a dynamic friction coefficient is reduced. As a result, compared to a dynamic friction state in which only the stage 3 is moved with respect to the driver elements 59 being in a halt state, dynamic friction force can be reduced.

Furthermore, since the driver elements 59 vibrate substantially in a plane parallel to the lower surface of the stage 3, bias force of the driver elements 59 against the stage 3 is not increased, i.e., friction force is not increased. Note that the piezoelectric element 50 slightly expands and contracts along the lateral direction (which is perpendicular to the lower surface of the stage 3) as it expands and contracts along the longitudinal direction (which is parallel to the lower surface of the stage 3). However, the expanding and contracting along the lateral direction is very small, compared to the expanding and contracting along the longitudinal direction, and thus hardly affects the stage 3.

In the above-described manner, friction force between each of the driver elements 59 and the stage 3 can be reduced. Accordingly, in moving the stage 3 only in the X direction by the first ultrasonic actuator 4A, the stage 3 can be prevented from rotating with the driver elements 59 of the second ultrasonic actuator 4B being centered and also friction loss between the stage 3 and each of the driver elements 59 can be reduced.

The above-described movements of the first and second ultrasonic actuators 4A and 4B can be used not only when the stage 3 is desired to be driven merely in the X direction toward a desired location in the X direction but also when the stage 3 is desired to be moved in the X direction in moving the stage 3 alternately in the X direction and in the Y direction in order to move the stage 3 to a desired location in any direction between the X direction and the Y direction.

In the above description, only the case where the stage 3 is moved in the X direction has been explained. In moving the stage 3 only in the Y direction, the roles of the first ultrasonic actuator 4A and the second ultrasonic actuator 4B are reversed.

Therefore, according to the Embodiment 1, in moving the stage 3 using only one of the first and second ultrasonic actuators 4A and 4B in a moving direction corresponding to the ultrasonic actuator, the other ultrasonic actuator is made to vibrate in parallel to the lower surface of the stage 3. Thus, a friction state between each of the driver elements 59 of the other ultrasonic actuator and the stage 3 is changed to a dynamic friction state and also the sliding speed of the driver elements 59 on the stage 3 is increased to reduce a dynamic friction coefficient. Accordingly, friction force between each of the driver elements 59 and the stage 3 can be reduced and the stage 3 can be smoothly and efficiently moved by the one ultrasonic actuator.

Moreover, by forming each of the first and second ultrasonic actuators 4A and 4B into a structure where vibration of the piezoelectric element 50 in parallel to the lower surface of the stage 3 is a longitudinal direction and also providing the driver elements 59 so that the driver elements 59 are symmetrically located about a center portion of a long side surface of the piezoelectric element 50 in the longitudinal direction, as described above, the driver elements 59 can be prevented from giving unnecessary driving power to the stage 3 when only vibration in parallel to the lower surface of the stage 3 is generated in the piezoelectric element 50 to slide the driver elements 59 with respect to the stage 3.

More specifically, even with the piezoelectric element 50 in a halt state, the driver elements 59 are biased against the stage 3 by the bias rubber 72 and thus small friction force is generated between each of the driver elements 59 and the stage 3 even when the piezoelectric element 50 is vibrated only in parallel to the lower surface of the stage 3. By the way, as described above, if the piezoelectric element 50 on which the driver elements 59 are provided so as to be symmetrically located about the center portion of the long side surface in the longitudinal direction is brought into longitudinal vibration, the driver elements 59 vibrate along the longitudinal direction with the center portion in the longitudinal direction as the center so that their respective vibration directions are opposite to each other but their amplitudes are the same. That is, friction force generated when the driver elements 59 slide with respect to the stage 3 is symmetrical about the center portion of the piezoelectric element 50 in the longitudinal direction and, therefore, respective frictions of the driver elements 59 cancel each other. As a result, when the piezoelectric element 50 is vibrated in parallel to the lower surface of the stage 3, driving force can be kept from being applied from the driver elements 59 to the stage 3, and accordingly damping of movement of the stage 3 by one of the ultrasonic actuators 4A and 4B can be prevented.

Furthermore, when each of the first and second ultrasonic actuators 4A and 4B is formed so that the vibration of the piezoelectric element 50 in parallel to the lower surface of the stage 3 is longitudinal vibration, the piezoelectric element 50 is arranged between the bottom wall portion 21 of the fixed member 2 and the stage 3 so that the lateral direction of the piezoelectric element 50 is perpendicular to the lower surface of the stage 3 and the longitudinal direction of the piezoelectric element 50 is in parallel to the surface of the stage 3. Therefore, compared to the structure in which the piezoelectric element 50 is arranged so that the longitudinal direction of the piezoelectric element 50 is perpendicular to the lower surface of the stage 3, a distance between the bottom wall portion 21 and the stage 3 can be reduced, thus resulting in downsizing of the drive unit 1.

Next, specific control of an oscillatory actuator according to Embodiment 1 will be described with reference to FIGS. 10, 11, 12 and 13. In the following description, each component having substantially the same function as that in the description above is identified by the same reference numeral and therefore the description thereof will be omitted.

Figure 10:
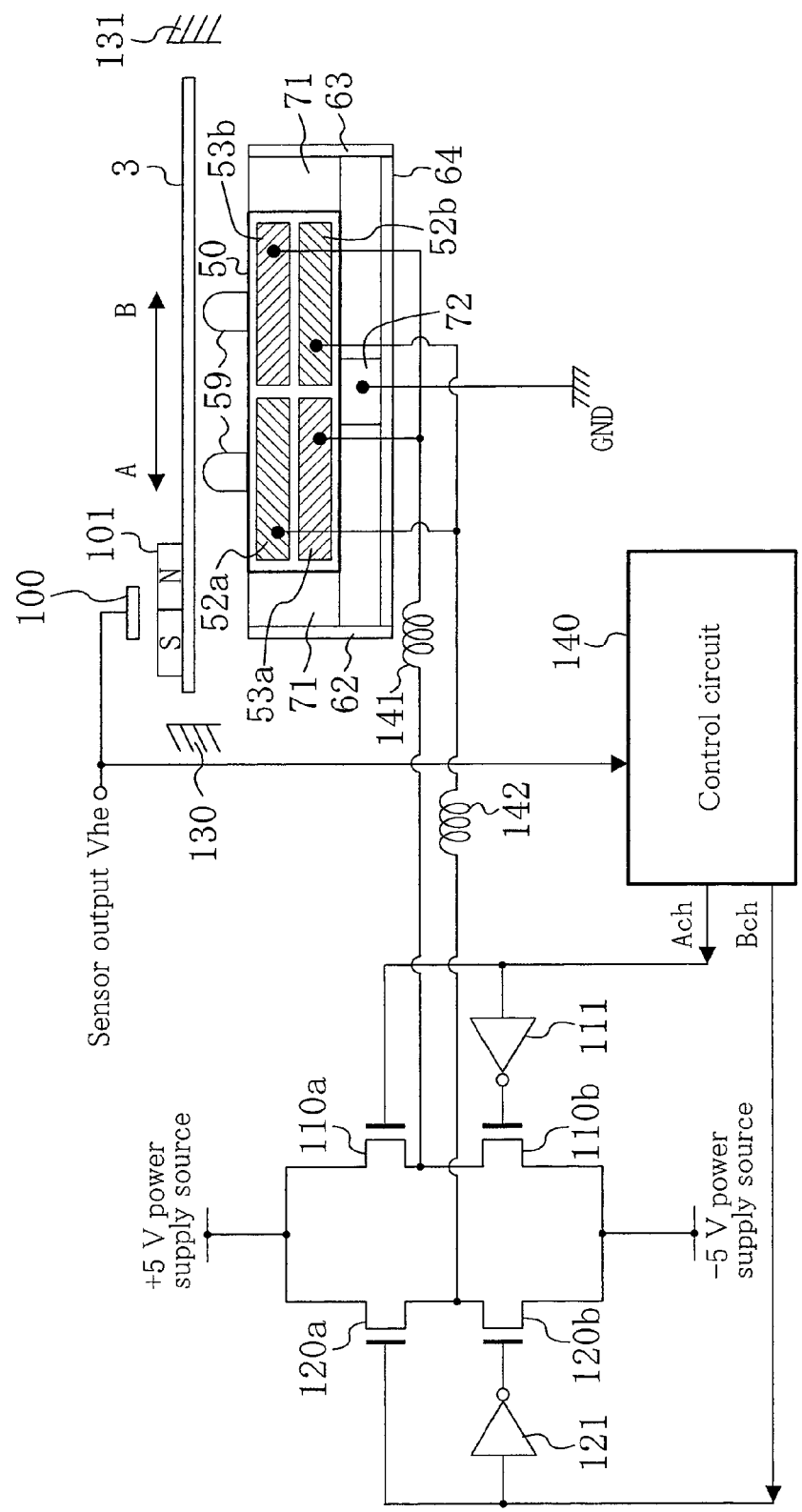
FIG. 10 is a circuit diagram illustrating a configuration of an oscillatory actuator control circuit.
Figure 11:
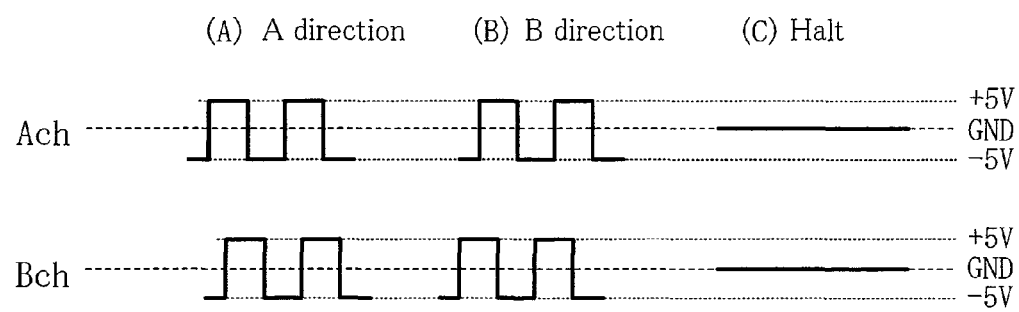
FIG. 11 is a waveform chart showing drive signals.

FIG. 10 is a circuit diagram illustrating a configuration of an oscillatory actuator control circuit. As described above, the oscillatory actuator includes a piezoelectric element 50, internal electrodes 52 and 53, driver elements 59, a first short side wall portion 62, a second short side wall portion 63, a long side wall portion 64, support rubbers 71 and a bias rubber 72. A stage 3 including ceramic reinforcing members 33 is formed as a movable member so as to be moved, as shown in FIG. 10, in an A direction and in a B direction.

As fixed members, which function in the same manner as support members (not shown), contact sections 130 and 131 (for example, the side wall sections 22) are provided, so that when the stage 3 is brought in contact with the contact section 130 or the contact section 131, the stage 3 is halted. In this structure, if power is supplied to the ultrasonic actuators 4A and 4B and the driver elements 59 vibrate so that the stage 3 is moved in the A direction or the B direction, the driver elements 59 slip with respect to the stage 3 at a time when the stage 3 is brought in contact with the contact section 130 or 131.

101 denotes a magnet attached to the stage 3 and the location of the stage 3 is detected by a location detection sensor 100 formed of a hall element.

The control circuit 140 receives an output of the location detection sensor 100. Then, the control circuit 140 controls a frequency and a phase of voltage pulse or current pulse to be applied to the piezoelectric element 50, based on location information for the stage 3, which is output from the location detection sensor 100. Signals for control of the frequency and the phase are output from an Ach and a Bch. The control circuit 140 can also perform ON/OFF control for a signal to be applied to the piezoelectric element 50.

As shown in FIG. 11A, in moving the stage 3 in the A direction, rectangular wave pulses are output from the Ach and the Bch, so that a phase difference between the Ach and the Bch is in a state where the phase of the Bch is delayed from the phase of the Ach by 90°. As shown in FIG. 11B, in moving the stage 3 in the B direction, rectangular wave pulses are output from the Ach and the Bch, so that a phase difference between the Ach and the Bch is in a state where the phase of the Bch is forwarded from the phase of the Ach by 90°. As shown in FIG. 11C, in halting the stage 3, signals from the Ach and the Bch are made to be at a GND level.

110a, 110b, 120a and 120b each denote switching devices, such as power FETs.

When a signal of the Ach to be input to the switching device 110a is +5 V, power is supplied to the electrodes 53a and 53b of the piezoelectric element 50 from a +5 V power supply source connected to the switching device 110a via a coil 141. On the other hand, when a signal from the Ach is input to the switching device 110b via an inverter 111 (which outputs −5 V when +5 V is input thereto, and outputs +5 V when −5 V is input thereto) and the signal from the Ach is +5 V, a signal input to the switching device 110b is −5 V. Accordingly, the switching device is OFF.

When a signal of the Ach to be input to the switching device 110a is −5 V, the switching device is OFF. On the other hand, when a signal from the Ach is input to the switching device 110b via the inverter 111 and the signal of the Ach is −5 V, a signal input to the switching device 110b is +5 V. Accordingly, power is supplied to the electrodes 53a and 53b of the piezoelectric element 50 from a −5 V power supply source connected to the switching device 110b via the coil 141.

When a signal of the Bch to be input to the switching device 120a is +5 V, power is supplied to the electrodes 52a and 52b of the piezoelectric element 50 from the +5 V power supply source via a coil 142. On the other hand, when a signal from the Bch is input to the switching device 120b via an inverter 121 (which outputs −5 V when +5 V is input thereto and outputs +5 V when −5 V is input thereto) and the signal of the Bch is +5 V, a signal input to the switching device 120b is −5 V. Accordingly, the switching device 120b is OFF.

When a signal of the Bch to be input to the switching device 120a is −5 V, the switching device is OFF. On the other hand, when a signal from the Bch is input to the switching device 120b via the inverter 121 and the signal of the Bch is −5 V, a signal input to the switching device 120b is +5 V. Accordingly, power is supplied to the electrodes 52a and 52b of the piezoelectric element 50 from a −5 V power supply source connected to the switching device 120b via the coil 142.

As in this embodiment, when a signal output from each FET is a rectangular wave signal, the signal includes not only the first-order frequency component but also a plurality of higher-order frequency components. Among signals to be applied to the piezoelectric element 50, harmonic frequency components such as the third-order frequency component and the fifth-order frequency component might cause a drop of driving efficiency and damage of a piezoelectric element itself. To cope with this, the coils 141 and 142 are provided, so that the first-order frequency components from frequency components of the rectangular wave are mainly applied to the piezoelectric element 50. When a signal output from each FET is a sine wave signal, the coils may be inserted or do not have to be inserted.

With the above-described configuration, the stage 3 is moved by supplying power to the piezoelectric element 50 to induce vibration of the driver elements 59 in the direction in which the stage 3 is to be moved and, based on an output of the location detection sensor 100, the control circuit 140 controls a power waveform to be applied to the piezoelectric element 50. Thus, the movement of the stage 3 can be controlled.

Figure 12:
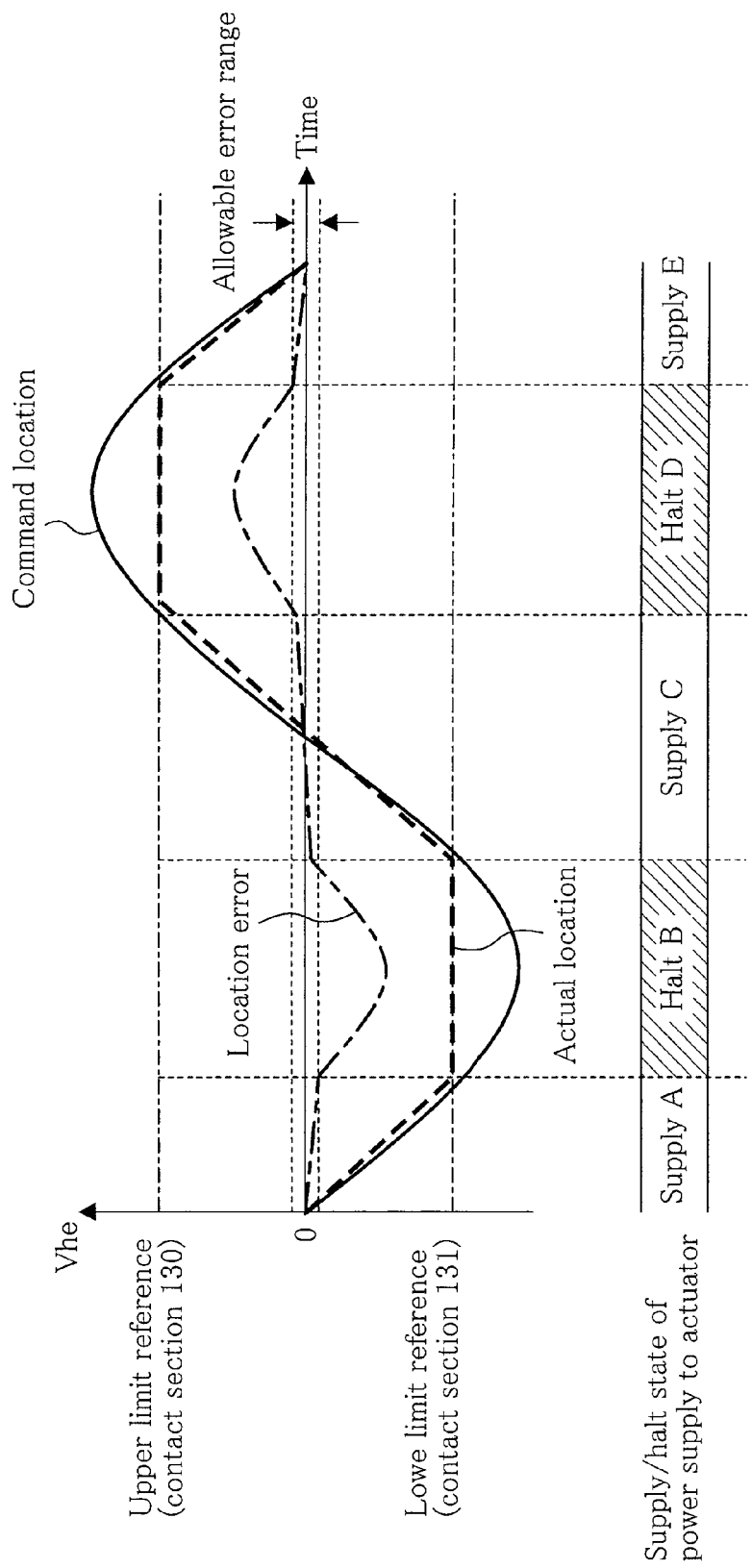
FIG. 12 is a timing chart showing the relationship between location of a target body to be driven and supply/halt period for power supply to an actuator.

FIG. 12 is a timing chart showing the relationship between the location of the stage 3 and a supply/halt period for power supply to the ultrasonic actuators 4A and 4B. In the graph of FIG. 12, the abscissa indicates time and the ordinate indicates voltage output from the location detection sensor 100. This voltage exhibits location information of the stage 3. As described above, the movement of the stage 3 is limited by the contact section 130 and 131. In FIG. 12, it is assumed that a state where the stage 3 is in contact with the contact section 130 is an upper limit reference and a state where the stage 3 is in contact with the contact section 131 is a lower limit reference. Also, 0 on the ordinate indicates an intermediate point between the upper limit reference and the lower limit reference. A dashed line in the graph indicates location information output from the location detection sensor 100 and corresponds to actual locations of the stage 3. A solid line in the graph corresponds to target locations (command location). In the control circuit 140, the location information output from the location detection sensor 100 is compared to location information for target locations which is generated in the control circuit and thereby location error information indicated by a dash-single-dot line in the graph is obtained. Based on the error information, signals of the Ach and the Bch shown in FIG. 11A are generated when a target location is located further in the A direction with respect to an actual location of the stage 3. When the target location is located further in the B direction with respect to the actual location of the stage 3, signals of the Ach and the Bch shown in FIG. 11B are generated. Also, when the target location is located at a point equivalent to the actual location, as shown in FIG. 11C, signals of the Ach and the Bch are made to be at the GND level.

Figure 13:
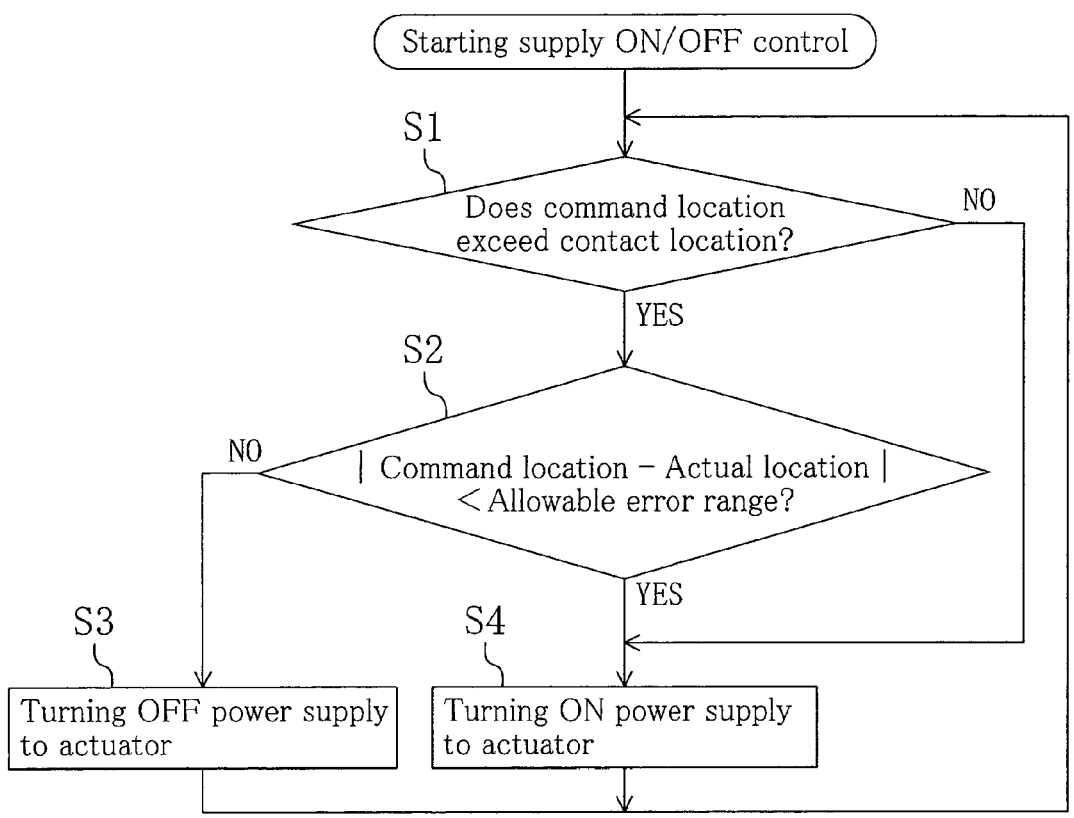
FIG. 13 is a flow chart showing the ON/OFF operation for power supply to an actuator.

Hereinafter, with reference to FIG. 13, a control method in which abrasion of both of the driver elements 59 and the stage 3 (specifically, the reinforcing members 33) due to slips between the driver elements 59 and the stage 3 is prevented by halting power supply to the ultrasonic actuators 4A and 4B according to the level of a location error generated when the stage 3 is in contact with the contact section 130 or 131 will be described. FIG. 13 is a flow chart showing the ON/OFF operation for power supply to the ultrasonic actuators 4A and 4B.

The operation starts with starting of power supply ON/OFF control. In Step 1 (S1), it is determined whether or not a command location exceeds a contact location (i.e., a location where the stage 3 is in contact with the contact section 130 or 131). By saying that the command location exceeds the contact location, it is meant that the command location is lower than the lower limit reference or the command location is higher than the upper limit reference.

When the command location does not exceed the contact location, the process proceeds to Step 4 (S4) and power supply to the ultrasonic actuators 4A and 4B is turned ON. On the other hand, when the command location exceeds the contact location, the process proceeds to Step 2 (S2).

In Step 2 (S2), it is determined whether or not an absolute value of a difference between the command location and the actual location is smaller than an allowable margin of error.

If the absolute value of the difference between the command location and the actual location is smaller than the allowable margin of error, the process proceeds to Step 4 (S4)

and power supply to the actuators is turned ON. That is, signals of the Ach and the Bch shown in FIG. 11A or shown in FIG. 11B are generated and the process returns to Step 1 (S1). On the other hand, if the absolute value of the difference between the command location and the actual location is equal to or larger than the allowable margin of error, the process proceeds to Step 3 (S3) and the power supply to the actuators is turned OFF. That is, signals of the Ach and the Bch are made to be the GND level as shown in FIG. 11C, and the process returns to Step 1 (S1).

With reference to FIG. 12, the ON/OFF operation for power supply to the ultrasonic actuators 4A and 4B when the graph of the command location exhibits a sinusoidal pattern will be described.

First, since the command location starts in a state where the command location does not exceed the contact location, the process starts in a state where power supply is ON (supply A). Next, when the command location exceeds the lower limit reference in the negative direction and the location error exceeds the allowable error range in the negative direction, power supply to the actuators is halted (halt B). Next, when the command location no longer exceeds the lower limit reference and the location error is within an allowable range, power supply to the actuators is restarted (supply C). Next, when the command location exceeds the upper limit reference in the positive direction and the location error exceeds the allowable error range in the positive direction, power supply to the actuators is halted (halt D). Then, when the command location no longer exceeds the upper limit reference and the location error is within the allowable range, power supply to the actuators is restarted (supply E).

Note that for a value of the location detection sensor 100, the point 0 might be shifted. In such a case, a shift of the point 0 can be corrected by moving the stage 3 to an end of a movable range (i.e., a contact section such as a location where the stage 3 is mechanistically immovable, as described in this embodiment) at start up and detecting an output voltage of the location detection sensor 100 at each end of the movable range.

The specific operation of the oscillatory actuator according to Embodiment 1 has been described. The specific operation described in this embodiment allows prevention of abrasion due to slips of the contact section where the driver elements 59 of the ultrasonic actuators 4A and 4B and the stage 3 as a target body to be driven are in contact with each other.

Note that in Step 1 (S1) of FIG. 13 in Embodiment 1, whether or not the command location exceeds the contact section is determined. However, regardless of the locations, when the driver elements 59 stay in contact with the same location on the stage 3 for a long time, power supply to the actuators 4A and 4B may be turned OFF.

As has been described, it is an object to provide control method and system for halting vibration of an actuator when a target body to be driven is brought in contact with a predetermined contact section and, on the other hand, restarting vibration of the actuator when the target body is separated from the contact section.

In other words, a control system for an oscillatory actuator includes a base, a movable body movable in a predetermined direction with respect to the base, a drive force generation section, including a piezoelectric element and a driver element, for moving the movable body with respect to the base by combining longitudinal vibration and transverse vibration of the piezoelectric element to have a driver element make an approximately elliptical motion, a location sensor for detecting a location of the movable body with respect to the base, and a control section for performing control so as to supply drive power to the drive force generation section according to the moving location (command location) of the movable body with respect to the base. The control section performs control so as to halt supply of drive power when the rate of change of a difference between the moving location (command location) and the location detected by the location detection sensor exceeds a predetermined threshold.

In the control system for an oscillatory actuator, in a case where supply of the drive power is halted, the control section restarts supply of the drive power when the moving location (command location) of the movable body has become the same as the moving location at a time of halting supply of drive power.

<<Embodiment 2>>

Next, Embodiment 2 of the present invention will be described. Embodiment 2 is different from Embodiment 1 in the point that a drive unit 201 of Embodiment 2 includes an ultrasonic actuator having a different structure from the structure of the ultrasonic actuator of Embodiment 1. Hereinafter, each member having the same structure as the structure described in Embodiment 1 is identified by the same reference numeral and therefore the description thereof will be omitted.

Figure 14:
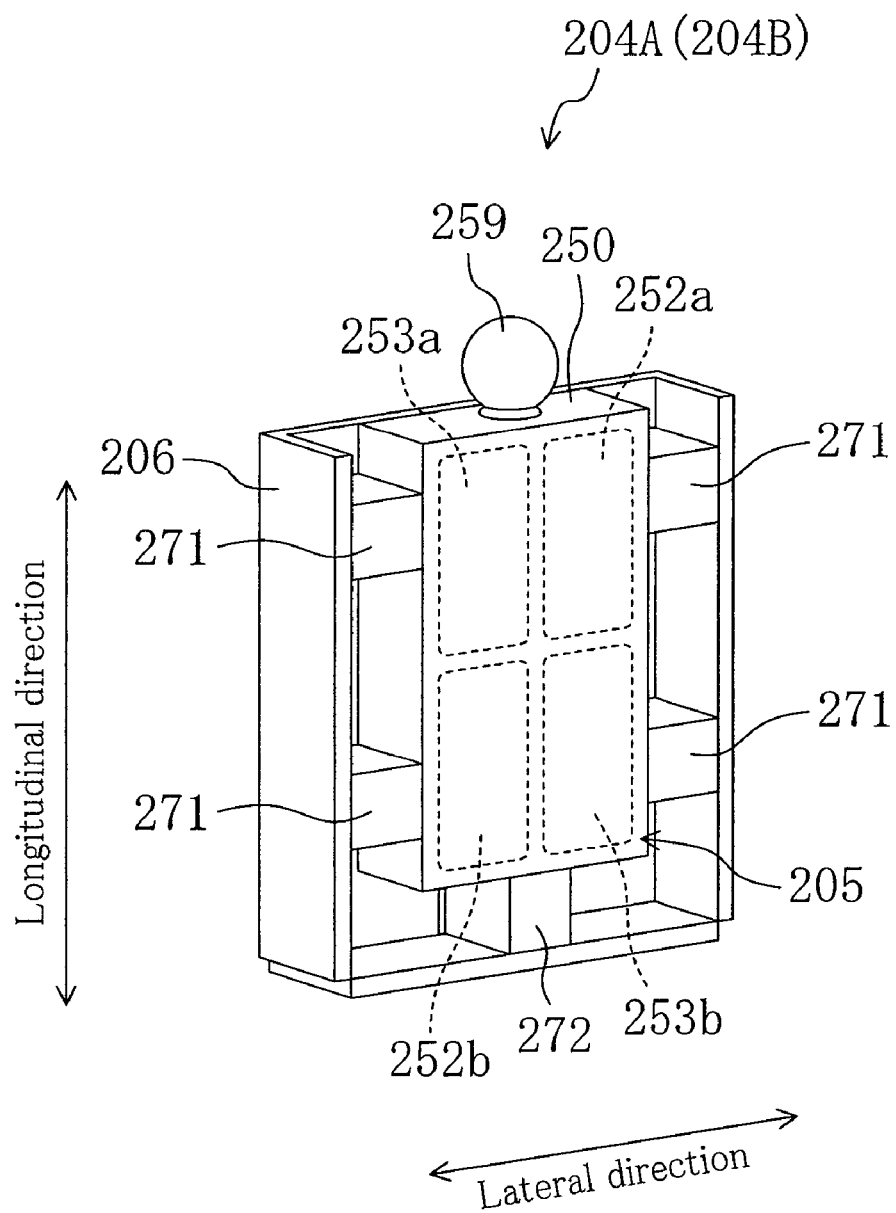
FIG. 14 is a perspective view of an ultrasonic actuator according to Embodiment 2.

As shown in FIG. 14, an actuator body 205 according to Embodiment 2 is provided with a single driver element 259 on one of short side surfaces of a piezoelectric element 250. The actuator body 205 is placed in a case 206 so that a bias rubber 272 is in contact with the other one of the short side surfaces of the piezoelectric element 250. In this state, the driver element 259 sticks out from the case 206. Each of long side surfaces of the piezoelectric element 250 has two support rubbers 271 so that the two support rubbers 271 are located between an associated one of the long side surfaces and the case 206.

Suppose that a principal surface of the piezoelectric element 250 is divided in four areas, i.e., two areas in the longitudinal direction and two areas in the lateral direction. In the piezoelectric element 250, first electrodes 252a and 252b and second electrodes 253a and 253b are provided in the same manner as in the piezoelectric element 50 of Embodiment 1. The first electrodes 252a and 252b and the second electrodes 253a and 253b may be formed so that power is separately supplied to each of the electrodes, or so that power is supplied for each pair of electrodes located in a diagonal direction of the principal surface at a time in the same manner as in Embodiment 1.

As shown in FIG. 8, longitudinal vibration and bending vibration are induced in cooperated manner in the piezoelectric element 250 by applying alternating voltages having phases shifted from each other by 90° to two pairs of electrodes each being located in an associated one of diagonal directions of the piezoelectric element 250, i.e., a pair of the first electrodes 252a and 252b and a pair of the second electrodes 253a and 253b, respectively. As a result, the driver element 259 makes an elliptical motion in a plane parallel to the principal surface of the piezoelectric element 250.

Each of first and second ultrasonic actuators 204A and 204B each having the above-described structure is arranged between a bottom wall portion 21 of a fixed member 2 and a lower surface of a stage 3 so that the driver element 259 is in contact with the lower surface of the stage 3 (specifically, a reinforcing member 33) and a longitudinal direction of the piezoelectric element 250 is in a normal direction of the lower surface of the stage 3. In other words, each of the first and second ultrasonic actuators 204A and 204B is arranged so that a direction of longitudinal vibration of the piezoelectric element 250 is perpendicular to the lower surface of the stage 3 and a direction of bending direction of the piezoelectric element 250 is in parallel to the lower surface of the stage 3.

In this structure, the first ultrasonic actuator 204A is arranged so that a lateral direction of the piezoelectric element 250 is in the X direction and the second ultrasonic actuator 204B is arranged so that a lateral direction of the piezoelectric element 250 is in the Y direction.

As has been described above, in this state, composite vibration of longitudinal vibration and bending vibration is generated in the actuator body 205 of each ultrasonic actuator 204A (204B), thereby driving the stage 3.

As in Embodiment 1, respective moving distances of the stage 3 by the first ultrasonic actuator 204A and the second ultrasonic actuator 204B are adjusted to combine respective movements of the stage 3 in the X direction and in the Y direction, so that the stage 3 can be moved in any direction in a plane parallel to the lower surface of the stage 3. lo In moving the stage 3 in only one of the X direction and the Y direction, i.e., for example, only in the X direction, the first ultrasonic actuator 204A causes the piezoelectric element 250 to generate composite vibration of longitudinal vibration and bending vibration to apply driving force to the stage 3, while the second ultrasonic actuator 204B causes the piezoelectric element 250 to generate vibration substantially only in a plane parallel to the lower surface of the stage 3, thereby sliding the driver element 259 with respect to the stage 3. Specifically, the second ultrasonic actuator 204B generates substantially only bending vibration of FIG. 7 in the piezoelectric element 250. By applying an alternating voltage only to one of the pairs of electrodes, i.e., the first electrodes 252a and 252b or the second electrodes 253a and the 253b, or applying alternating voltages having phases shifted from each other by 180° to the first electrodes 252a and 252b and the second electrodes 253a and the 253b, respectively, substantially only bending vibration can be generated in the piezoelectric element 250. In this case, the driver element 259 vibrates in a plane parallel to the lower surface of the stage 3 without increasing bias force against the stage 3. As a result, the driver element 259 slides with respect to the stage 3.

Therefore, according to Embodiment 2, as in Embodiment 1, in moving the stage 3 by only one of the first and second ultrasonic actuators 204A and 204B in a moving direction in accordance with the ultrasonic actuator, the other one of the first and second ultrasonic actuators 204A and 204B is vibrated in parallel to the lower surface of the stage 3, i.e., only bending vibration of the other ultrasonic actuator is induced. Thus, a friction state between the driver element 259 of the other ultrasonic actuator and the stage 3 is made to be a dynamic friction state. Also, the sliding speed of the driver element 259 on the stage 3 is increased and the dynamic friction coefficient is reduced, so that friction force between the driver element 259 and the stage 3 can be reduced. Accordingly, the stage 3 can be smoothly and efficiently moved by the one ultrasonic actuator.

<<Embodiment 3>>

Subsequently, Embodiment 3 of the present invention will be described. Embodiment 3 is different from Embodiment 1 in the point that a drive unit includes an ultrasonic actuator having a different structure from the structure of the ultrasonic actuator of Embodiment 1. Hereinafter, each member having the same structure as the structure described in Embodiment 1 is identified by the same reference numeral and therefore the description thereof will be omitted.

Figure 15:
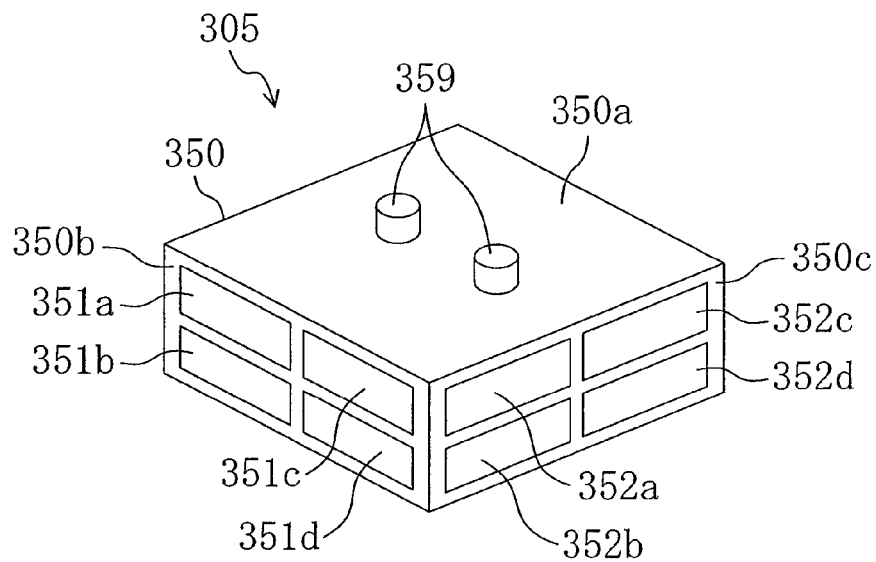
FIG. 15 is a perspective view of an actuator body according to Embodiment 3.
Figure 16:
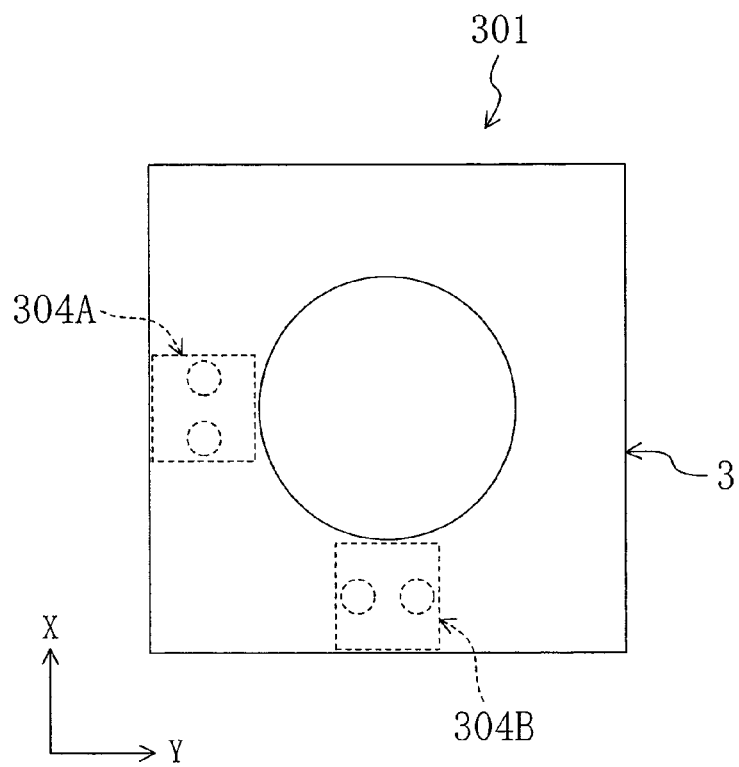
FIG. 16 is a plan view schematically illustrating arrangement of an ultrasonic actuator.

Each of first and second ultrasonic actuators 304A and 304B according to Embodiment 3 includes an actuator body 305 of FIG. 15, a case (not shown) for housing the actuator body 305, support rubbers (not shown) for elastically supporting the actuator body 305 in the case, and a bias rubber (not shown) for biasing the actuator body 305 against the stage 3.

As shown in FIG. 15, the actuator body 305 includes a metal body part 350, a plurality of piezoelectric elements 351a, 351b . . . , and driving elements 359 provided on the body part 350.

The body part 350 includes an upper surface 350a and a lower surface (not shown) each having an approximately square shape and four side surfaces 350b and 350c (only two are shown in FIG. 15) each having an approximately rectangular shape. Each of the side surfaces is arranged so that both of long side portions thereof are in touch with an associated one of side portions of the upper surface 350a and an associated one of side portions of the lower surface, i.e., a lateral direction of each of the side surfaces is in the vertical direction.

Two driving elements 359 are provided on the upper surface 350a of the body part 350. The two driving elements 359 are arranged so as to align in a line passing through the barycenter of the upper surface 350a and extending in parallel to a pair of side portions of the upper surface 350a.

Four piezoelectric elements 351a, 351b, 351c and 351d and four piezoelectric elements 352a, 352b, 352c and 352d are attached, respectively, onto two side surfaces of 350b and 350c of the body part 350 which are adjacent to each other. The piezoelectric elements 351a, 351b, 351c and 351d are respectively arranged in four areas, i.e., two areas in the longitudinal direction and two areas in the lateral direction of the side surface 350b. In the same manner, piezoelectric elements 352a, 352b, 352c and 352d are respectively arranged in four areas, i.e., two areas in the longitudinal direction and two areas in the lateral direction of the side surface 350c. Unlike Embodiments 1 and 2, the piezoelectric elements 351a, 351b, 351c and 351d and the piezoelectric elements 352a, 352b, 352c and 352d are formed so that a signal electrode is provided in each piezoelectric element. Accordingly, an entire piezoelectric element uniformly expands and contracts by supplying power to the entire piezoelectric elements at a time.

In the actuator body 305 having the above-described structure, on the side surface 350b, alternating voltages having phases shifted from each other by 90° are respectively applied to the pair of piezoelectric elements 351a and 351d diagonally located and the other pair of piezoelectric elements 351b and 351d diagonally located, thereby generating longitudinal vibration along a longitudinal direction of the side surface 350b and bending vibration along a lateral direction of the side surface 350b in a cooperated manner in the body part 350. As a result, each of the driving elements 359 makes an approximately elliptical motion in a plane parallel to the side surface 350b. Also, in the actuator body 305, on the side surface 350c, alternating voltages having phases shifted from each other by 90° are applied to the pair of piezoelectric elements 352a and 352d diagonally located and the other pair of piezoelectric elements 352b and 352d diagonally located, respectively, thereby generating longitudinal vibration along a longitudinal direction of the side surface 350c and bending vibration along a lateral direction of the side surface 350c in a cooperated manner in the body part 350. As a result, each of the driving elements 359 makes an approximately elliptical motion in a plane parallel to the side surface 350c.

As the ultrasonic actuator 4A and 4B of the Embodiment 1 shown in FIGS. 1 and 2, each of the first and second ultrasonic actuators 304A and 304B each of which includes the actuator body 305 having the above-described structure is arranged between a bottom wall portion 21 of a fixed member 2 and a lower surface of a stage 3 (specifically, a reinforcing member 33). Specifically, the first ultrasonic actuator 304A is arranged in vicinity of one side edge portion of the lower surface of the stage 3 so that the direction in which the driving elements 359 align is in parallel to the side edge portion (this direction is referred to as an X direction), i.e., the longitudinal direction of the side surface 350b of the piezoelectric element 350 is in parallel to the side edge portion. On the other hand, the second ultrasonic actuator 304B is arranged in vicinity of another side edge portion of the lower surface of the stage 3 which is perpendicular to the one side edge portion so that the direction in which the driving elements 359 align is in parallel to the side edge portion (this direction is referred to as a Y direction), i.e., the longitudinal direction of the side surface 350b of the piezoelectric element 350 is in parallel to the side edge portion.

In the drive unit 301 having the above-described structure, the first ultrasonic actuator 304A has the driving elements 359 make an approximately elliptical motion in a plane parallel to the side surface 350b (of which the longitudinal direction is in the X direction), basically, by driving the piezoelectric elements 351a, 351b, 351c and 351d provided on the side surface 350b. That is, the first ultrasonic actuator 304A is mainly used to move the stage 3 in the X direction. On the other hand, the second ultrasonic actuator 304B has the driving elements 359 to make an approximately elliptical motion in a plane parallel to the side surface 350b (of which the longitudinal direction is in the Y direction), basically, by driving the piezoelectric elements 351a, 351b, 351c and 351d provided on the side surface 350b. That is, the first ultrasonic actuator 304B is mainly used to move the stage 3 in the Y direction.

In moving the case where the stage 3 in only one of the X direction and the Y direction, for example, only in the Y direction, the second ultrasonic actuator 304B has the driving elements 359 make an approximately elliptical motion in a plane parallel to the side surface 350b of which the longitudinal direction is in the Y direction, thereby moving the stage 3 in the Y direction and, on the other hand, the first ultrasonic actuator 304A has the driving elements 359 vibrate in a plane parallel to the side surface 350c by driving the piezoelectric elements 352a, 352b, 352c and 352d provided on the side surface 350c of which the longitudinal direction is in the Y direction. At this time, in the first ultrasonic actuator 304A, alternating voltages having the same phase are applied to the four piezoelectric elements 352a, 352b, 352c and 352d on the side surface 350c to generate only longitudinal vibration along the longitudinal direction of the side surface 350c in the actuator body 305. Thus, the driving elements 359 of the first ultrasonic actuator 304A perform only longitudinal vibration in the Y direction.

Therefore, according to Embodiment 3, in moving the stage 3 only in one of the X direction and the Y direction, composite vibration of longitudinal vibration and bending vibration is generated in one of the ultrasonic actuators in which the direction of alignment of the driving elements 359 matches a moving direction of the stage 3 and, on the other hand, only longitudinal vibration is generated in the other one of the ultrasonic actuators in which the direction of alignment of the driving elements 359 does not match the moving direction of the stage 3 and, more specifically, in the direction in which the alignment direction is perpendicular to the moving direction. Thus, a friction state between each of the driving elements 359 in one of the ultrasonic actuator in which the direction of alignment of the driving elements 359 does not match the moving direction of the stage 3 and the stage 3 is made to be a dynamic friction state and the sliding speed of the driving elements 359 on the stage 3 is increased, thereby reducing the dynamic friction coefficient. This allows reduction in friction force between each of the driving elements 359 and the stage 3, so that the stage 3 can be smoothly and efficiently moved by one of the ultrasonic actuators in which the direction of alignment of the driving elements 359 matches the moving direction of the stage 3.

In this case, since the longitudinal direction of the driving elements 359 in one of the ultrasonic actuators in which the direction of alignment of the driving elements 359 does not match the moving direction of the stage 3 matches the moving direction of the stage 3, influences on the movement of stage 3 by the driving elements 359 which slide with respect to the stage 3 while making longitudinal vibration can be reduced.

In Embodiment 3, the body part 350 is formed so that the lateral direction of each side surface is in the vertical direction and the body part 350 has a vertically flat rectangular parallelepiped shape. However, the body part 350 is not limited thereto. That is, the body part 350 may be formed to have a vertically long rectangular parallelepiped shape in which the longitudinal direction of each side surface is in the vertical direction. In such case, in moving the stage 3 in only one of the X direction and the Y direction, one of the ultrasonic actuators in which the direction of alignment of the driving elements 359 does not match the moving direction of the stage 3 and more specifically, the alignment direction is perpendicular to the stage 3 causes the body part 350 to generate only bending vibration as in Embodiment 2. Thus, the driving elements 359 can be made to slide with respect to the stage 3.

The driving elements 359 are arranged on a straight line passing through the lo barycenter of the upper surface 350a and extending parallel to a pair of side portions of the upper surface 350a. However, the alignment of the driving elements 359 is not limited thereto.

<<Embodiment 4>>

Subsequently, Embodiment 4 of the present invention will be described. According to Embodiment 4, a control of a drive unit 401 is performed in a different manner from a control of the drive unit in Embodiment 1. Hereinafter, each member also described in Embodiment 1 is identified by the same reference numeral and therefore description thereof will be omitted.

Figure 17A:
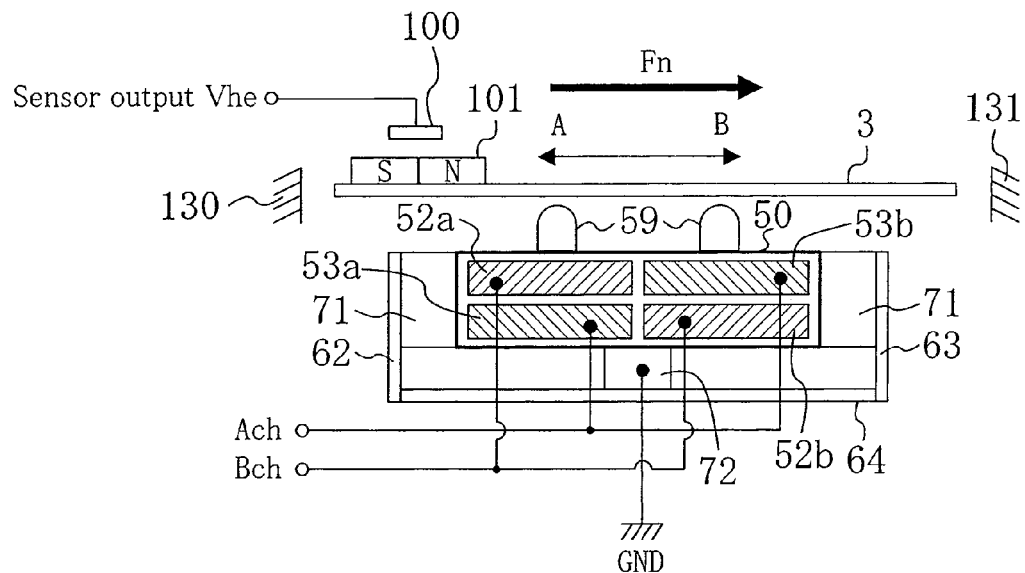
FIGS. 17A and 17B are schematic views illustrating a configuration of an oscillatory actuator control circuit.
Figure 17B:
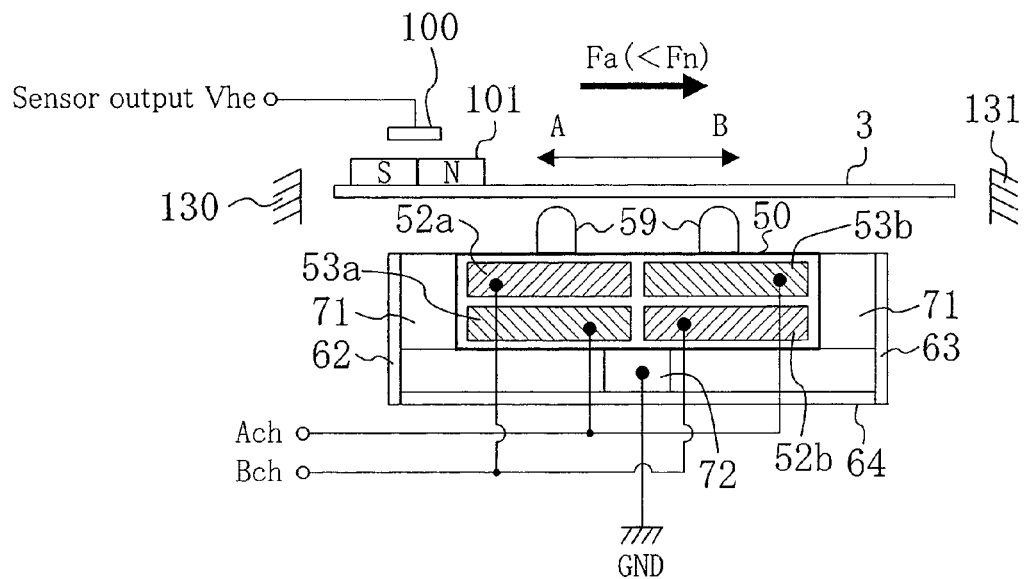
Figure 18:
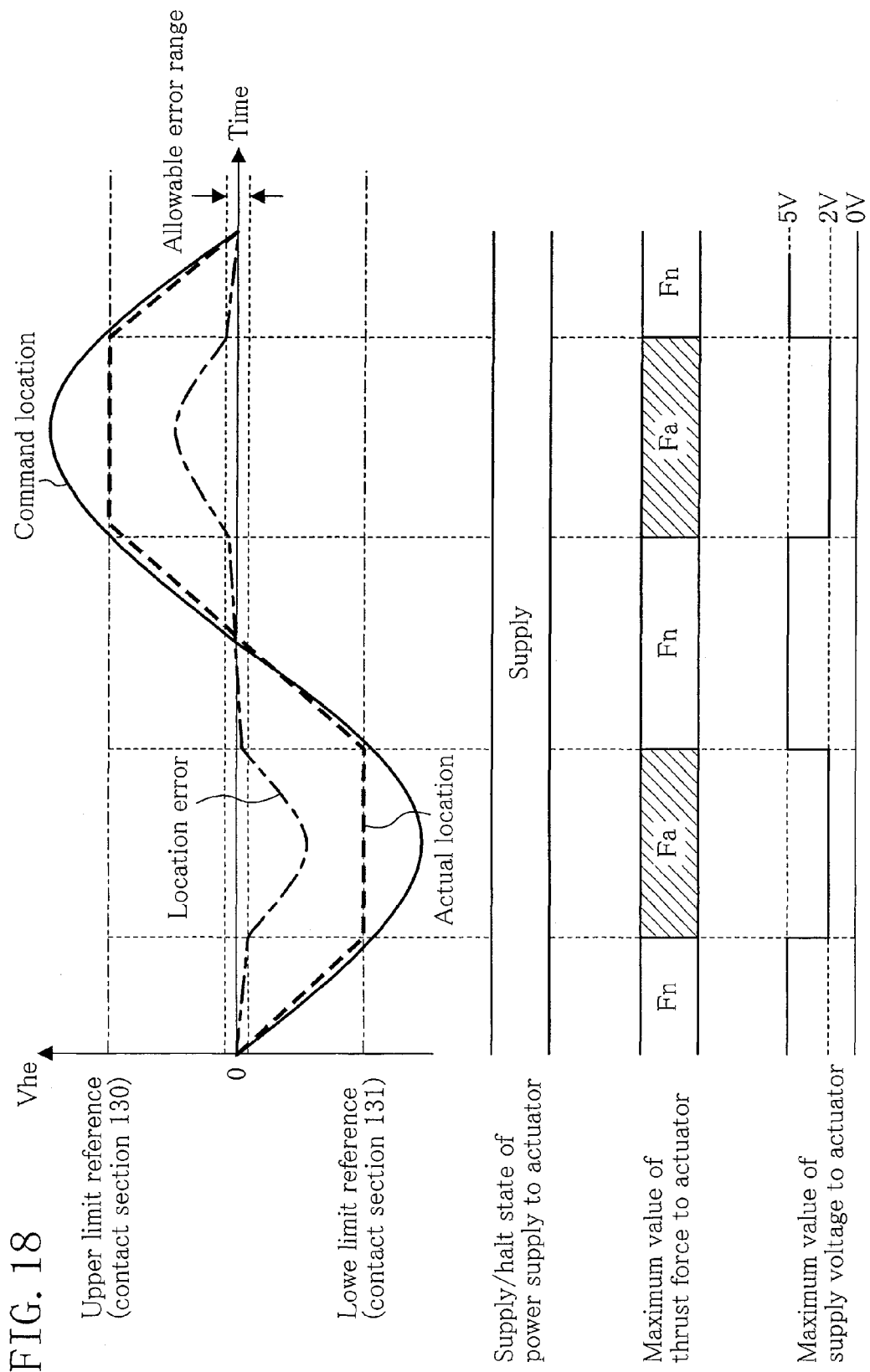
FIG. 18 is a timing chart illustrating change with time in a location of a stage 3 and a maximum value of thrust force of an ultrasonic actuator 4A.
Figure 19:
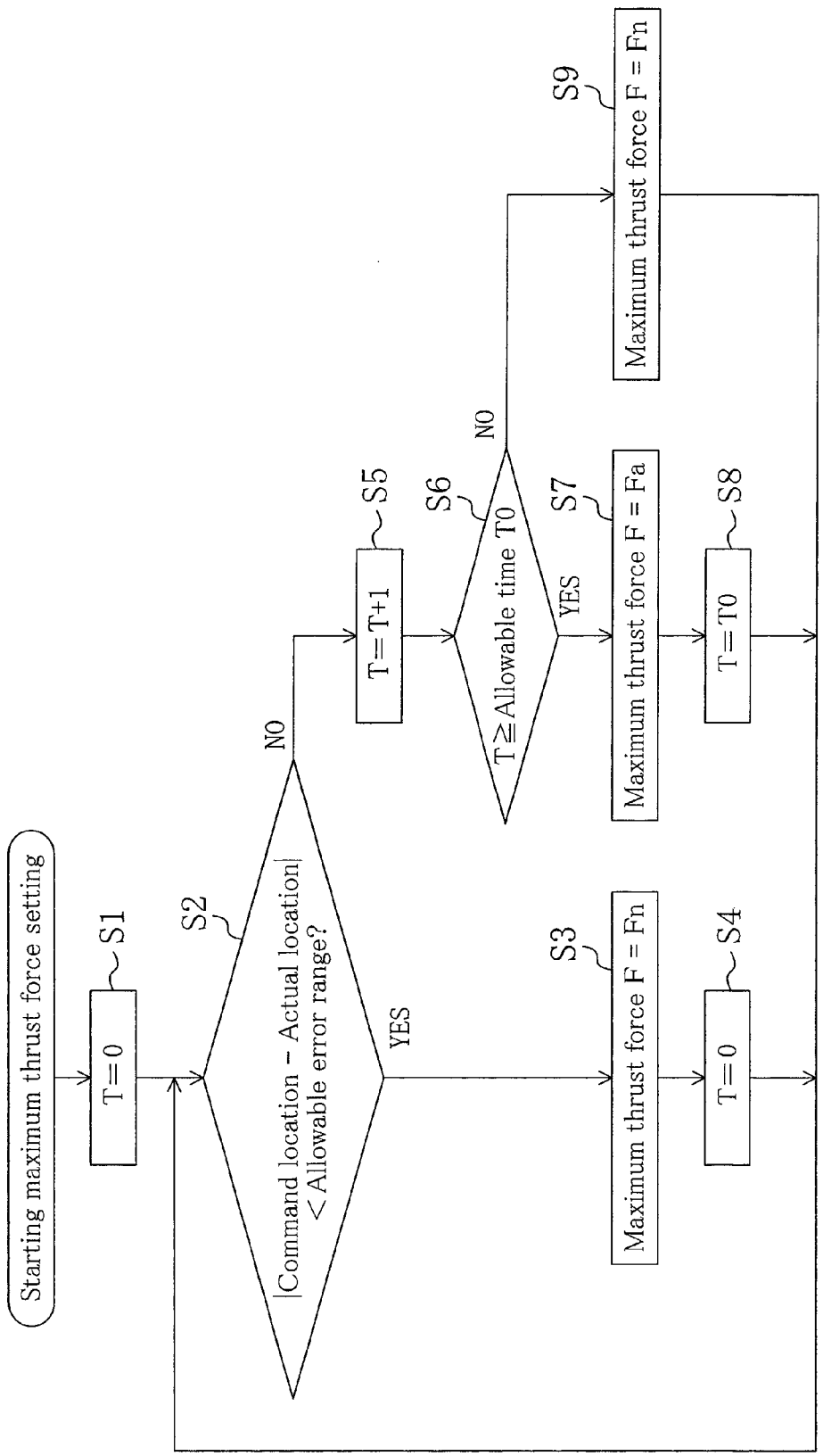
FIG. 19 is a flow chart showing control for setting of a maximum value of thrust force to the ultrasonic actuator 4A.

The drive unit 401 has the same configuration as that of the drive unit of Embodiment 1. Specifically, the drive unit 401 controls the first ultrasonic actuator 4A and the second ultrasonic actuator 4B to move the stage 3 in any direction. When the stage 3 is in contact with the contact section 130 or the contact section 131, the drive unit 401 reduces a power supply level to one of the first or second ultrasonic actuators 4A and 4B which corresponds to a moving direction. This point is different from Embodiment 1 in which when the stage 3 is in contact with the contact section 130 or the contact section 131, power supply to the first or second ultrasonic actuators 4A or 4B is stopped. Hereinafter, a control of the first ultrasonic actuator 4A which corresponds to the X direction when the stage 3 is in contact with the contact section 130 or the contact section 131 in the X direction will be described with reference to FIGS. 17A through 17C, FIG. 18 and FIG. 19. FIG. 17A is a view illustrating a drive state of the stage driven by the ultrasonic actuator in a normal operation. FIG. 17B is a view illustrating a drive state of the stage driven by the ultrasonic actuator when the stage is in contact with the contact section. FIG. 18 is a timing chart illustrating change with time in a location of the stage 3 and a maximum value of thrust force of an ultrasonic actuator 4A. FIG. 19 is a flow chart lo of a control for setting of the maximum value of thrust force applied to the ultrasonic actuator 4A.

Specifically, as shown in FIG. 17A, in a normal operation, i.e., when the stage 3 is not in contact with either one of the contact section 130 and the contact section 131, the drive unit 401 drives the stage 3 by the ultrasonic actuator 4A so that the maximum value of thrust force is Fn [N]. In FIG. 17A, the stage 3 is moving toward the right of FIG. 17A (i.e., in the B direction in FIG. 17A) with a maximum thrust force Fn. In this case, the maximum value Fn of thrust force is defined, for example, by the magnitude of load at a time when a load is externally applied to the stage 3 in the opposite direction to the moving direction and thus the stage 3 is stopped.

As shown in FIG. 17B, the drive unit 401 sets the maximum value of thrust force to the ultrasonic actuator 4A to be Fa [n] when the stage 3 is in contact with the contact section 130 or the contact section 131. In FIG. 17B, the stage 3 is in contact with the contact section 131 at the right in FIG. 17B (i.e., in the B direction in FIG. 17B) and presses the contact section 131. The maximum value Fa of thrust force is defined by a pressing force of the stage 3 against the contact section 131.

In this case, the drive unit 401 controls the power supply level for the ultrasonic actuator 4A so that the maximum value Fa of thrust force to the ultrasonic actuator 4A when the stage 3 is in contact with the contact section 130 or the contact section 131 is smaller than the maximum value Fn of thrust force in a normal operation. Thus, abrasion at contact parts of the driving elements 59 and the stage 3 which are in contact with each other can be suppressed and durability of the drive unit 401 can be improved. Specifically, when the stage 3 is in contact with the contact section 130 or the contact section 131, the driving elements 59 slip with respect to the stage 3. Thus, contact surfaces of the driving elements 59 and the stage 3 are abraded. To cope with this, the maximum value of thrust force when the stage 3 is in contact with the contact section 130 or the contact section 131 is set to be smaller than that in a normal operation. Thus, slips of the driving elements 59 and the stage 3 can be suppressed. As a result, abrasion of the contact surfaces of the driving elements 59 and the stage 3 due to the slips thereof can be reduced.

Subsequently, a specific control of the ultrasonic actuator 4A will be described. In the graph of FIG. 18, the abscissa indicates time and the ordinate indicates voltage output from the location detection sensor 100. This voltage exhibits location information of the stage 3. As described above, the movement of the stage 3 is limited by the contact sections 130 and 131. In FIG. 18, it is assumed that a state where the stage 3 is in contact with the contact section 130 is an upper limit reference and a state where the stage 3 is in contact with the contact section 131 is a lower limit reference. Also, 0 on the ordinate indicates an intermediate point between the upper limit reference and the lower limit reference. A dashed line in the graph indicates location information output from the location detection sensor 100 and corresponds to actual locations of the stage 3. A solid line in the graph corresponds to target locations (command location). In the control circuit 140, the location information output from the location detection sensor 100 is compared to location information for target locations which is generated in the control circuit 140 and thereby location error information indicated by a dash-single-dot line in the graph of FIG. 18, is obtained. Based on the error information, signals of Ach and Bch shown in FIG. 11A are generated when a target location is located further in the A direction with respect to the actual location of the stage 3. When the target location is located further in the B direction with respect to the actual location of the stage 3, signals of the Ach and Bch shown in FIG. 11B are generated. Also, when the target location is located at a point equivalent to the actual location, as shown in FIG. 11C, signals of the Ach and Bch are made to be at the GND level.

A control is started with "Starting maximum thrust force setting" of FIG. 19. In Step 1 (S1), a timer count T in the control circuit 140 is initialized (T=0). In Step 2 (S2), it is determined whether or not an absolute value of a difference between the command location and the actual location is smaller than an allowable error.

When the absolute value of the difference between the command location and the actual location is smaller than the allowable error, the process proceeds to Step 3 (S3) and the maximum value F of thrust force is set to be Fn. Specifically, voltages supplied to the power FETs 110a, 110b, 120a and 120b from the +5 V power supply source and the −5 V power supply source are set to be +5 V and −5 V, respectively, thereby setting the maximum value F of thrust force to Fn. Thereafter, the process proceeds to Step 4 and the timer count T is initialized (T=0). Then, the process returns to Step 2 (S2). That is, whether or not the absolute value of the difference between the command location and the actual location is smaller than the allowable error is a condition for setting the maximum value F of thrust force to Fn.

On the other hand, when the absolute value of the difference between the command location and the actual location is equal to or larger than the allowable error, the process proceeds to Step 5 (S5), the timer count T is incremented (by 1) and then the process proceeds to Step 6 (S6). In Step 6 (S6), the timer count T is compared to an allowable time T0 and it is determined whether or not the timer count T is equal to or larger than the allowable time T0. If the timer count T is smaller than the allowable time T0, the process proceeds to Step 9 (S9). After setting the maximum value F of thrust force to Fn, the process returns to Step 2 (S2). If the timer count T is equal to or larger than the allowable time T0, the process proceeds to Step 7 (S7) and the maximum value F of thrust force is set to be Fa. Specifically, voltages supplied to the power FETs 110a, 110b, 120a and 120b from the +5 V power supply source and the −5 V power supply source are set to be +2 V and −2 V, respectively, thereby setting the maximum value F of thrust force to Fa. Thereafter, the process proceeds to Step 8 (S8), preset of the timer count T is performed (T=T0), and then the process returns to Step 2 (S2). That is, whether or not a time at which the absolute value of the difference between the command location and the actual location is equal to or larger than the allowable error is equal to or larger than the allowable time T0 in Step 3 (S3) and Step 7 (S7) is a condition for setting the maximum value F of thrust fore to Fa.

The control of the first ultrasonic actuator 4A when the stage 3 is in contact with the contact section 130 or the contact section 131 in the X direction has been described so far. When the stage 3 is in contact with the contact section 130 or the contact section 131 in the Y direction, the same control may be performed to the second ultrasonic actuator 4B.

According to Embodiment 4, unlike Embodiment 1 in which a control is performed by switching a state of power supply to the ultrasonic actuator 4A between a power supply state and a halt state, electric power is continuously supplied to the ultrasonic actuator 4A even when the stage 3 is in contact with the contact section 130 or the contact section 131. However, the maximum value of power supply to the ultrasonic actuator 4A is reduced at a time when the stage 3 is brought in contact with the contact section 130 or the contact section 131, and thereby abrasion of contact parts of the drive elements 59 and the stage 3 due to slips thereof can be suppressed.

Note that the increment of the timer count T in Step 5 (S5) may be performed by time unit (for example, 1 ms) in which the control circuit 140 can perform processing. Moreover, the allowable time T0 may be set to be within a range of 2-100 ms in order to distinguish the control operation from a normal operation. As numerical examples for the maximum values Fn and Fa of thrust force, Fn is set to be within a range of 2-5 G and Fa is set to be within a range of 1-2 G. Thus, the performance of controlling a rapid change in load in a normal operation can be maintained and also slips of the driving elements 59 and the stage 3 with each other can be suppressed by reducing thrust force within a practical range when the stage 3 is in contact with the contact section. Moreover, in this case, a control of the maximum value of thrust force is realized by controlling the power supply voltage. However, the maximum value of thrust force may be controlled by controlling a frequency of driving voltage or a phase difference between two driving voltages to be input to the Ach and Bch.

<<Other Embodiments>>

According to the present invention, the following structure may be adopted for the above-described embodiments.

Specifically, in each of the above-described embodiments, the stage 3 is supported by the fixed member 2. However, how to support the stage 3 is not limited thereto. More specifically, an arbitrary supporting structure may be adopted as long as the structure can make the stage 3 move in a predetermined plane.

The stage 3 is provided with the reinforcing members 33. However, a structure in which the reinforcing members 33 are not provided may be used.

The drive unit includes two ultrasonic actuators in total, i.e., the first and second ultrasonic actuators. However, the number of ultrasonic actuators is not limited to two. For example, a structure in which a third ultrasonic actuator is provided so as to be opposed to the first ultrasonic actuator and the stage 3 is moved in the X direction using two ultrasonic actuators may be adopted. Furthermore, a fourth ultrasonic actuator for moving the stage 3 in some other direction than the X direction and the Y direction may be provided.

Also, the above-described ultrasonic actuators are not limited to the above-described structure. For example, each of the ultrasonic actuators do not have to have the structure in which power is supplied to piezoelectric elements via the support rubbers and the bias rubber but may have a structure in which lead lines are connected to piezoelectric elements to supply power to the piezoelectric elements. Moreover, a structure in which a node potion of vibration of each piezoelectric element is supported by an anelastic member may be adopted. Furthermore, the actuator body is formed of a piezoelectric element. However, the actuator body may be formed of a structure in which a piezoelectric element is attached onto a substrate of metal or the like or a structure in which an oscillator is formed of metal or the like and a piezoelectric element is inserted therein. In such structure, an oscillator including a piezoelectric element constitutes an actuator body. That is, an arbitrary structure can be adopted as long as the structure is formed so as to include a piezoelectric element and is capable of generating vibration in two different vibration directions.

Furthermore, when a target body to be driven is mechanistically limited, slips of an actuator and the target body can be suppressed to a minimum level and abrasion of the actuator and the target body due to the slips can be prevented.

Note that the above-described embodiments are essentially preferable examples which are illustrative and do not limit the present invention, its applications and the scope of use of the invention.

What is claimed is:

1. A control system for an oscillatory actuator, the control system comprising:
   a base;
   a target body to be driven formed to be movable in a predetermined direction with respect to the base;
   an actuator body supported by the base, including a piezoelectric element and a driver element, for moving the target body with respect to the base by combining longitudinal vibration and transverse vibration of the piezoelectric element to have the driver element make an approximately elliptical motion;
   a location detection sensor configured to detect a location of the target body with respect to the base; and
   a control section, operatively coupled to the actuator body and the location detection sensor, which generates a command location representing a target location of the target body and supplies to the actuator body, in order to move the target body to the command location, a drive signal corresponding to the command location,
   wherein the control section halts supply of the drive signal when an absolute value of a difference between the command location and the location of the target body detected by the location detection sensor becomes larger than a predetermined threshold, and
   wherein the generated command location can vary in time, and in a case where supply of the drive signal has been halted as a result of the absolute value of the difference becoming larger than the predetermined threshold, the control section is configured to continue generating the command location and comparing the command location and the location of the target body detected by the location detection sensor, and to restart supply of the drive signal when the absolute value of the difference between the command location and the location of the target body detected by the location detection sensor becomes equal to or lower than the predetermined threshold.

2. The control system of claim 1, further comprising at least one contact section configured to limit a range of movement of the target body in the predetermined direction.

3. The control system of claim 2, wherein the command location generated by the control section can exceed the range of movement of the target body.

* * * * *